(12) United States Patent
Kamigaichi et al.

(10) Patent No.: US 8,134,198 B2
(45) Date of Patent: Mar. 13, 2012

(54) NONVOLATILE SEMICONDUCTOR MEMORY

(75) Inventors: Takeshi Kamigaichi, Kanagawa (JP); Yasuhiko Matsunaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 737 days.

(21) Appl. No.: 11/563,069

(22) Filed: Nov. 24, 2006

(65) Prior Publication Data

US 2007/0132007 A1 Jun. 14, 2007

(30) Foreign Application Priority Data

Dec. 1, 2005 (JP) ................................. 2005-348372

(51) Int. Cl.
*H01L 29/788* (2006.01)
(52) U.S. Cl. ..................................... 257/316; 257/E29.3
(58) Field of Classification Search .................. 257/316, 257/E29.3
See application file for complete search history.

(56) References Cited

U.S. PATENT DOCUMENTS

| | | | | |
|---|---|---|---|---|
| 4,630,086 A | * | 12/1986 | Sato et al. ................ | 365/185.06 |
| 5,397,723 A | * | 3/1995 | Shirota et al. ................ | 438/257 |
| 6,127,224 A | * | 10/2000 | Pio ................................ | 438/258 |
| 6,900,098 B1 | * | 5/2005 | Ogura et al. .................. | 438/257 |
| 2005/0073001 A1 | | 4/2005 | Kamigaichi et al. | |

FOREIGN PATENT DOCUMENTS

JP 2004-14783 1/2004

* cited by examiner

*Primary Examiner* — Tucker Wright
(74) *Attorney, Agent, or Firm* — Oblon, Spivak, McClelland, Maier & Neustadt, L.L.P.

(57) ABSTRACT

A nonvolatile semiconductor memory includes active regions ... $AA_{j-1}, AA_j, AA_{j-1}, \ldots$ formed in a semiconductor substrate; a plurality of word lines WL0, WL1, ... in the row direction; memory cell transistors, each including a floating gate provided on the semiconductor substrate via a tunneling insulating film, an inter-gate insulating film disposed on the floating gate, and a control gate disposed on the inter-gate insulating film, disposed on intersections of word lines and active regions; select gate lines SGD in the row direction; bit line contacts CB disposed on the active regions; and a plurality of bit lines in the column direction and connected to the active regions via the bit line contacts; and the bit line contacts are formed by forming an electrode material for the bit line contacts in lines in the row direction and cutting the electrode material for each of the bit lines to avoid contact-failure of bit line contacts CB.

10 Claims, 23 Drawing Sheets

NONVOLATILE SEMICONDUCTOR MEMORY

CROSS REFERENCE TO RELATED APPLICATIONS AND INCORPORATION BY REFERENCE

This application is based upon and claims the benefit of priority from prior Japanese Patent Application P2005-348372 filed on Dec. 1, 2005; the entire contents of which are incorporated by reference herein.

BACKGROUND OF THE INVENTION

1. Field of the Invention

The present invention relates to a structure of a nonvolatile semiconductor memory. For example, it relates to the nonvolatile semiconductor memory and a fabrication method for the same characterized by a method of forming bit line contacts used to connect a plurality of bit lines to a plurality of NAND columns of diffusion layers in NAND flash memory.

2. Description of the Related Art

An electrically erasable/programmable read-only memory (EEPROM), for example, is known as a nonvolatile semiconductor memory. The EEPROM, more specifically a NAND EEPROM, has a memory cell array of a plurality of memory cell transistors disposed on respective intersections of a plurality of word lines extending along the row direction and a plurality of bit lines extending along the column direction perpendicular to the plurality of word lines. The memory cell transistors are generally made from stacked gate MOS transistors, each constructed by stacking a floating gate and a control gate, for example.

The NAND flash memory has a structure including a NAND string of a plurality of memory cell transistors connected in series and selector transistors disposed on both sides of the NAND string. Furthermore, each of a plurality of element isolating regions (STI) between a plurality of active regions of the memory cell transistors is arranged in parallel to the column direction, configuring the memory cell array.

In a fabrication processing of a plurality of bit line contacts CB used to connect a plurality of bit lines to respective diffusion layers of a plurality of NAND columns in the NAND flash memory, once select gate lines and the word lines are formed, an interlayer insulating film is deposited, and then contact holes are formed for filling an electrode material therein, which becomes bit line contacts CB. Generally, as the process miniaturization of fine patterns develops, the fabrication processing of contact holes not only becomes more difficult, but the interlayer insulating film between contact holes for adjacent bit line contacts CB in the row direction becomes thinner. The thinning effect of the interlayer insulating film between contact holes for adjacent bit line contacts cause a serious effect for the short-circuiting between adjacent bit lines, when a poor cleaning process or the like is performed.

The same problem may occur regarding the distance between the bit line contacts CB and the select gate lines along the column direction. In other words, as the process miniaturization of fine patterns develops, the fabrication processing of contact holes not only becomes more difficult, but the interlayer insulating film between contact holes for bit line contacts CB and the select gate line becomes thinner. The thinning effect of the interlayer insulating film between contact holes for bit line contacts CB and the select gate line cause the serious effect for the short-circuiting between adjacent bit lines via the select gate line, when a poor cleaning process or the like is performed.

Once an electrode material for the bit line contacts CB is deposited and then planarized, the electrode material is filled in the contact holes for the bit line contacts CB. As the process miniaturization of fine patterns develops, an embedding processing of the electrode material for filling the contact holes for the bit line contacts CB becomes difficult.

The difficulty of the embedding processing of the electrode material for filling the contact holes for the bit line contacts CB brings about a serious effect for an electrically-open failure between the bit line contact CB and the NAND column in the active region at the bottom of the contact hole for the bit line contact CB.

A nonvolatile semiconductor memory having a common source line of a stacked structure of two or more types of conductive materials, and a fabrication method for the same, which suppresses the height of source lines so as to prevent increase in the aspect ratio of bit line contacts, and suppresses the decrease in lithography margin such as an exposure tolerance factor in a gate electrode patterning process are already disclosed (for example, see Japanese Patent Laid-open No. 2004-14783).

SUMMARY OF THE INVENTION

An aspect of the present invention inheres in a nonvolatile semiconductor memory, which include a plurality of active regions extending along a column direction formed in a semiconductor substrate; a plurality of word lines extending along a row direction, a plurality of memory cell transistors, each of the memory cell transistors including a floating gate electrode provided on the semiconductor substrate via a tunneling insulating film, an inter-gate insulating film disposed on the floating gate electrode, and a control gate electrode disposed on the inter-gate insulating film, and the plurality of memory cell transistors are disposed on intersections of the plurality of word lines and the plurality of active regions; a plurality of select gate lines extending along the row direction in parallel to the word lines; a plurality of bit line contacts disposed on the active regions; and a plurality of bit lines extending along the column direction and connected to the plurality of active regions via the bit line contacts. The bit line contacts are formed by forming an electrode material for the bit line contacts in a plurality of lines along the row direction and cutting the electrode material for each of the bit lines.

Another aspect of the present invention inheres in a fabrication method for a nonvolatile semiconductor memory, which includes: removing a gate insulating film on a semiconductor substrate only in a region in which a bit line contact is to be formed; forming a contact diffusion layer of a memory cell transistor on the semiconductor substrate, where the gate insulating film is removed; forming a floating gate electrode of the memory cell transistor on the semiconductor substrate; forming an inter-gate insulating film on the floating gate electrode; removing a part of the inter-gate insulating film; forming a control gate electrode of the memory cell transistor on the exposed floating gate electrode and on the inter-gate insulating film; forming a control gate electrode masking material on the control gate electrode; processing an electrode material for the control gate electrodes, which becomes word lines, select gate lines, and bit line contacts, into a plurality of lines along the row direction; and cutting the electrode material processed into a plurality of lines, forming bit line contacts for each of the bit lines.

Another aspect of the present invention inheres in a fabrication method for a nonvolatile semiconductor memory, which includes: removing a gate insulating film on a semiconductor substrate only in a region in which a bit line contact is to be formed, and forming a contact diffusion layer; forming a floating gate electrode on the semiconductor substrate; forming an inter-gate insulating film on the floating gate electrode; removing a part of the inter-gate insulating film; forming a control gate electrode on the exposed floating gate electrode and on the inter-gate insulating film; forming a control gate electrode masking material on the control gate electrode; processing a first electrode material for the control gate electrode, which becomes word lines, and select gate lines, into lines along the row direction; forming an interlayer insulating film on the entire surface of the semiconductor substrate; processing the interlayer insulating film through etching; forming a second electrode material for bit line contact plugs in lines along the row direction; and cutting the second electrode material processed into a plurality of lines, forming bit line contacts for each of the bit lines.

DETAILED DESCRIPTION OF THE INVENTION

Figure 1:
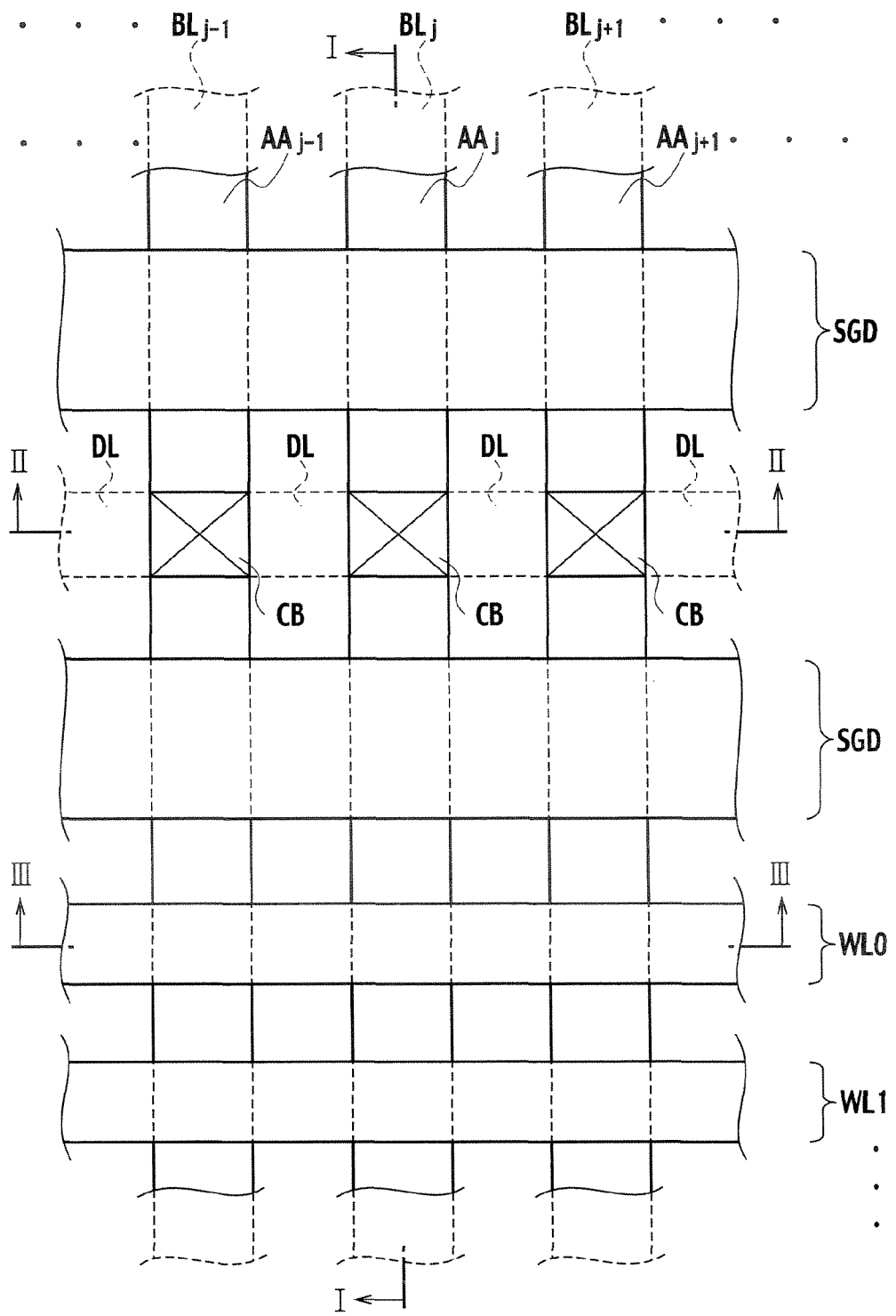
FIG. 1 schematically shows a plan view of a nonvolatile semiconductor memory according to a first and a second embodiment of the present invention, more specifically, a memory cell array and the bit line contacts CB regions of a NAND flash memory.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Referring to the drawings, embodiments of the present invention are described below. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

Next, a first to a sixth embodiment of the present invention are described while referencing drawings. The same or similar reference numerals are attached to the same or similar parts in the following drawing description. Note that those drawings are merely schematics and thus relationship between thickness of respective parts and two-dimensional size thereof and ratio of respective parts in thickness may be inconsistent with reality according to the present invention. Moreover, it is natural that there are parts differing in relationship and ratio of dimensions among the drawings.

The technical ideas according to the present invention may be modified into a variety of modifications within the scope of the claimed invention.

With nonvolatile semiconductor memories according to the embodiments of the present invention and fabrication methods for the same, an electrode material to become bit line contacts CB is formed in lines in the row direction, and the electrode material formed in lines is then cut so as to form the bit line contacts CB for the respective bit lines divided in each NAND columns. This provides a more effective means of improving production yield of the nonvolatile semiconductor memory that avoids a short-circuits between adjacent bit lines and the contact-failures of the bit line contacts CB and the element active regions, and further increasing the process miniaturization of fine patterns and realizing a high integration.

With nonvolatile semiconductor memories according to the embodiments of the present invention and fabrication methods for the same, contact failures such as short-circuits between adjacent bit lines and contact failures such as electrical-openings of the bit line contacts CB to the element active regions can be avoided.

FIRST EMBODIMENT

NAND Type

Plan View Pattern Structure

A schematic plan view pattern structure of a memory cell array and bit line contact CB regions of a NAND flash memory, according to a nonvolatile semiconductor memory of the first embodiment of the present invention, includes a plurality of active regions ... $AA_{j-1}, AA_j, AA_{j+1}, \ldots$, which extend along the column direction, a plurality of word lines WL0, WL1, ..., which extend along the row direction, a pair of select gate lines SGD-SGD, which are arranged in parallel to the row direction of the word lines WL0, WL1, ..., bit line contacts CB, which are disposed on the active regions ... $AA_{j-1}, AA_j, AA_{j+1}, \ldots$ in a row direction, and a plurality of bit lines ... $BL_{j-1}, BL_j, BL_{j+1}, \ldots$, which extend along the column direction and connected to the plurality of active regions ... $AA_{j-1}, AA_j, AA_{j+1}, \ldots$ via the plurality of bit line contacts CB, as shown in FIG. 1.

(Circuit Structure)

Figure 2:
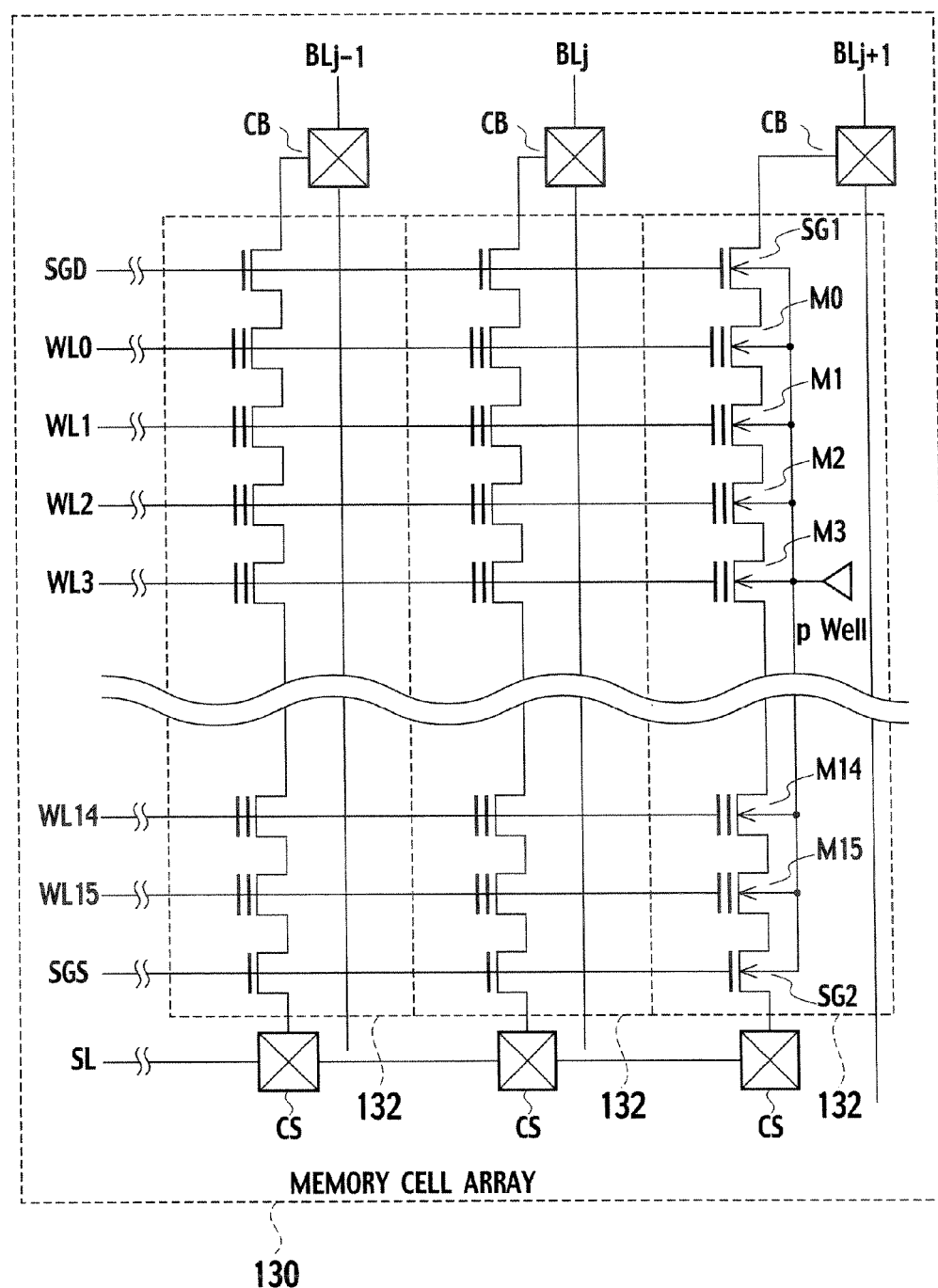
FIG. 2 schematically shows a circuit of a memory cell array in the nonvolatile semiconductor memory according to the first and the second embodiment of the present invention, more specifically, a circuit of a NAND memory cell array therein.

A schematic circuit structure of a memory cell array 130 in the nonvolatile semiconductor memory, according to the first embodiment of the present invention, corresponding to FIG. 1 is presented as shown in FIG. 2.

Each of a plurality of NAND cell units 132 is constituted by memory cell transistors M0 through M15 and select gate transistors SG1 and SG2, as shown in detail in FIG. 2. The drains of the select gate transistors SG1 are connected to respective bit lines ..., $BL_{j-1}, BL_j, BL_{j+1}, \ldots$ via respective bit line contacts CB, while the sources of the select gate transistors SG2 are connected to the common source line SL via respective source line contacts CS.

The nonvolatile semiconductor memory according to the first embodiment of the present invention has a NAND flash EEPROM structure as a basic structure, as described later, including memory cell transistors with a stacked gate structure, which includes a gate insulating film 20 as a tunneling insulating film formed on a p-well or semiconductor substrate 10, a floating gate electrode 40 further disposed on the gate insulating film 20, an inter-gate insulating film 25 disposed on the floating gate electrode 40, and a control gate electrode 70 disposed on the inter-gate insulating film 25.

A plurality of memory cell transistors M0 through M15 are connected in series, extending along the column direction in parallel to the plurality of bit lines ..., $BL_{j-1}, BL_j, BL_{j+1}, \ldots$, via $n^+$ source/drain diffusion layers 32 of the respective memory cell transistors. The select gate transistors SG1 and SG2 are disposed on either end the series connected memory cell transistors M0 through M15, and the bit line contacts CB and the source line contacts CS are connected to the series connected memory cell transistors M0 through M15 via the select gate transistors SG1 and SG2.

As a result, the memory cell transistors M0 through M15 and select gate transistors SG1 and SG2 constitute each of the NAND cell units 132, which are arranged in parallel to the row direction extending along the plurality of word lines WL0, WL1, WL2, WL3, ..., WL14, and WL15 perpendicular to the bit lines ..., $BL_{j-1}, BL_j, BL_{j+1}, \ldots$.

In addition, as shown in FIG. 2, the gate electrodes of the select gate transistors SG1 are respectively connected to a select gate line SGD, and the gate electrodes of the select gate transistors SG2 are respectively connected to a select gate line SGS. The select gate line SGD and the select gate line SGS extend along the row direction arranged in parallel to the plurality of word lines WL0, WL1, WL2, WL3, ..., WL14, and WL15.

The reason why the pair of select gate lines SGD-SGD is shown in FIG. 1 is because the NAND cell units 132 of FIG. 2 have a replicated structure in the column direction centered on the bit line contacts CB.

(Fabrication Method)

A fabrication process of the nonvolatile semiconductor memory according to the first embodiment of the present invention is described while referencing FIGS. 1 through 18.

Figure 3:
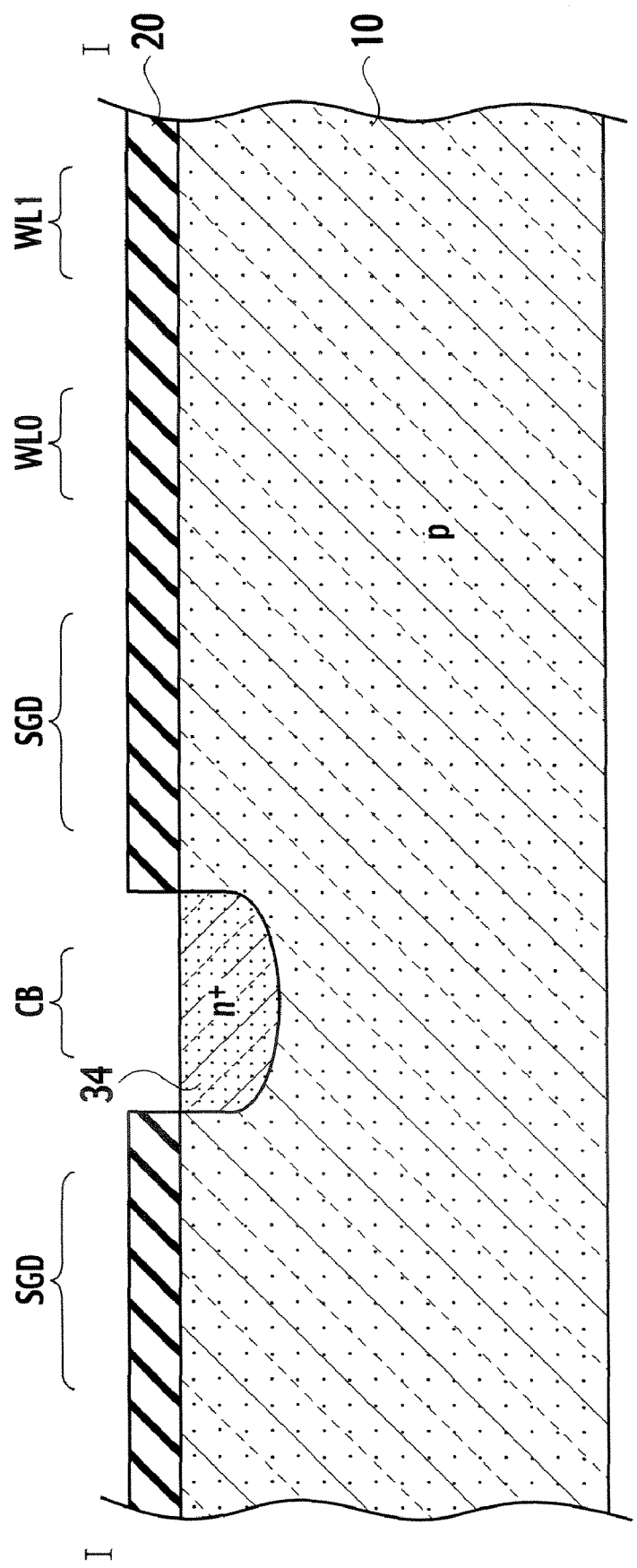
FIG. 3 schematically shows a cross-section of the nonvolatile semiconductor memory, according to the first embodiment of the present invention, cut along the line I-I of FIG. 1 describing a step of a fabrication process thereof.

(a) FIG. 3 schematically shows a cross-section of the nonvolatile semiconductor memory, according to the first embodiment of the present invention, cut along the line I-I of FIG. 1 describing a step of a fabrication process of the nonvolatile semiconductor memory.

First, as shown in FIG. 3, a gate insulating film 20 is formed on a p-type semiconductor substrate 10 through thermal oxidation or the like, the gate insulating film 20 is removed from only a region in which a bit line contact CB is to be formed, and an $n^+$ contact diffusion layer 34 is formed only in the region in which the bit line contact CB is to be formed.

While necessary impurity doping processes for the device operation are performed in the p-type semiconductor substrate 10 using ion implantation techniques or the like, to form a p-well region, a n-well region, and the like, description of the p-well region and the n-well region is omitted in FIG. 3 for sake of simplicity, merely showing the p type semiconductor substrate 10.

The gate insulating film 20 is used as the tunneling insulating film for memory cell transistors as well as the gate insulating film for the select gate transistors. Dimensions along the row direction and the column direction of the removed region should be large enough for the bit line contacts CB to make electrical connection without touching the select gate lines SGD-SGD.

Figure 4:
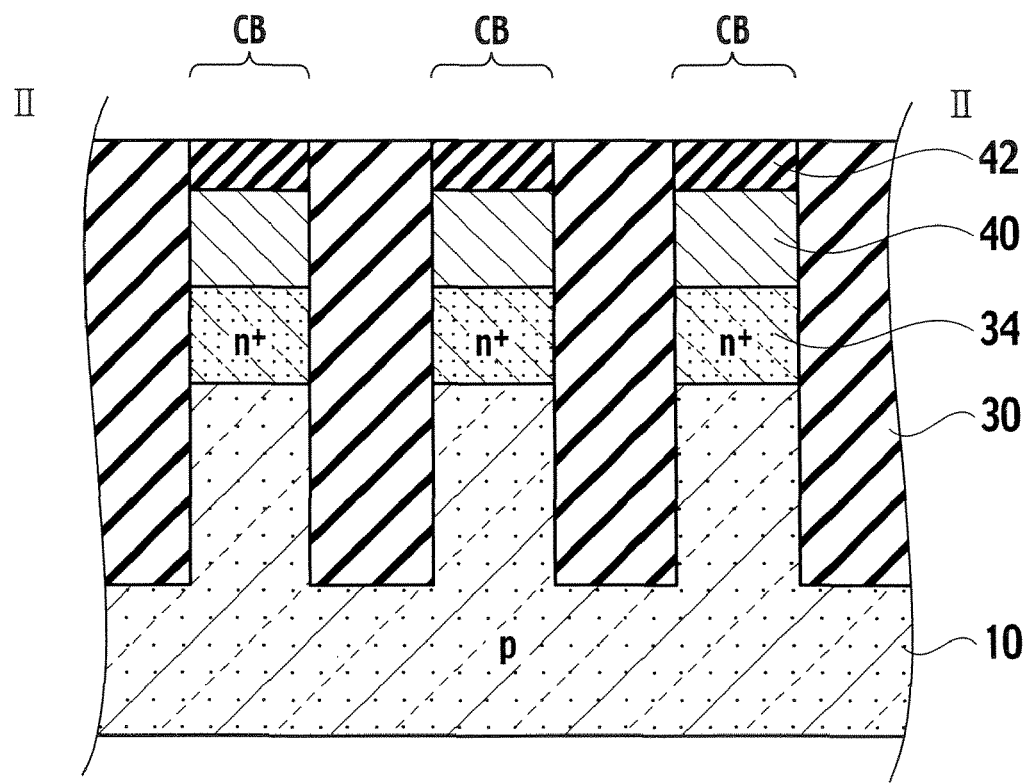
FIG. 4 schematically shows a cross-section of the nonvolatile semiconductor memory, according to the first embodiment of the present invention, cut along the line II-II of FIG. 1 describing a step of the fabrication process thereof.
Figure 5:
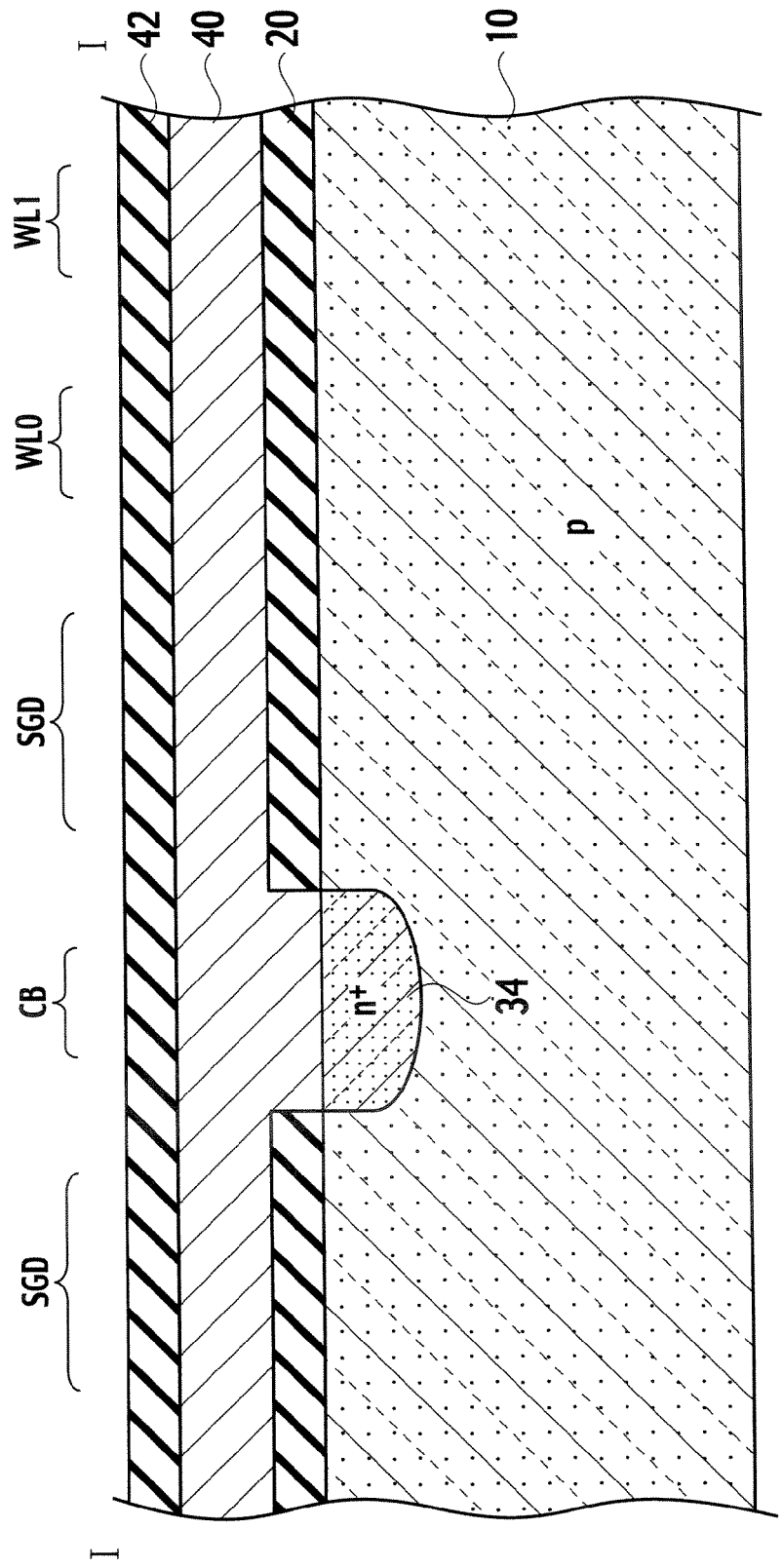
FIG. 5 schematically shows a cross-section of the nonvolatile semiconductor memory, according to the first embodiment of the present invention, cut along the line I-I of FIG. 1 describing a step of the fabrication process thereof.

(b) FIG. 4 schematically shows a cross-section of the nonvolatile semiconductor memory, according to the first embodiment of the present invention, cut along the line II-II of FIG. 1 describing a step of the fabrication process of the nonvolatile semiconductor memory. FIG. 5 schematically shows a cross-section of the nonvolatile semiconductor memory, according to the first embodiment of the present invention, cut along the line I-I of FIG. 1 describing a step of the fabrication process of the nonvolatile semiconductor memory.

Next, as shown in FIGS. 4 and 5, an electrode material, which becomes floating gate electrodes for the memory cell transistors and also becomes the bit line contacts CB (hereafter referred to as floating gate electrodes 40), and an insulating film, which becomes masking material for an etching process and a planarization process in a subsequent formation step for element isolating regions 30 (hereafter referred to as floating gate electrodes masking material 42), are deposited across the entire surface of the semiconductor substrate 10. The floating gate electrodes masking material 42 is preferably a film having high etching selectivity relative to the insulating film in the element isolating regions 30.

(c) Furthermore, as shown in FIGS. 4 and 5, grooves are formed in the element isolating regions 30 through lithography and etching, an insulating film which becomes the element isolating regions 30 is deposited, and a planarization process such as a chemical mechanical polishing (CMP) techniques or the like is then carried out.

As a result, FIG. 4 schematically shows a cross-section cut along the line II-II of FIG. 1 after formation of grooves in the element isolating regions 30 through lithography and etching, deposition of the insulating film which becomes the element isolating regions 30, and a planarization process is carried out, and FIG. 5 schematically shows a cross-section, cut along the line I-I of FIG. 1 after the same processes.

Figure 6:
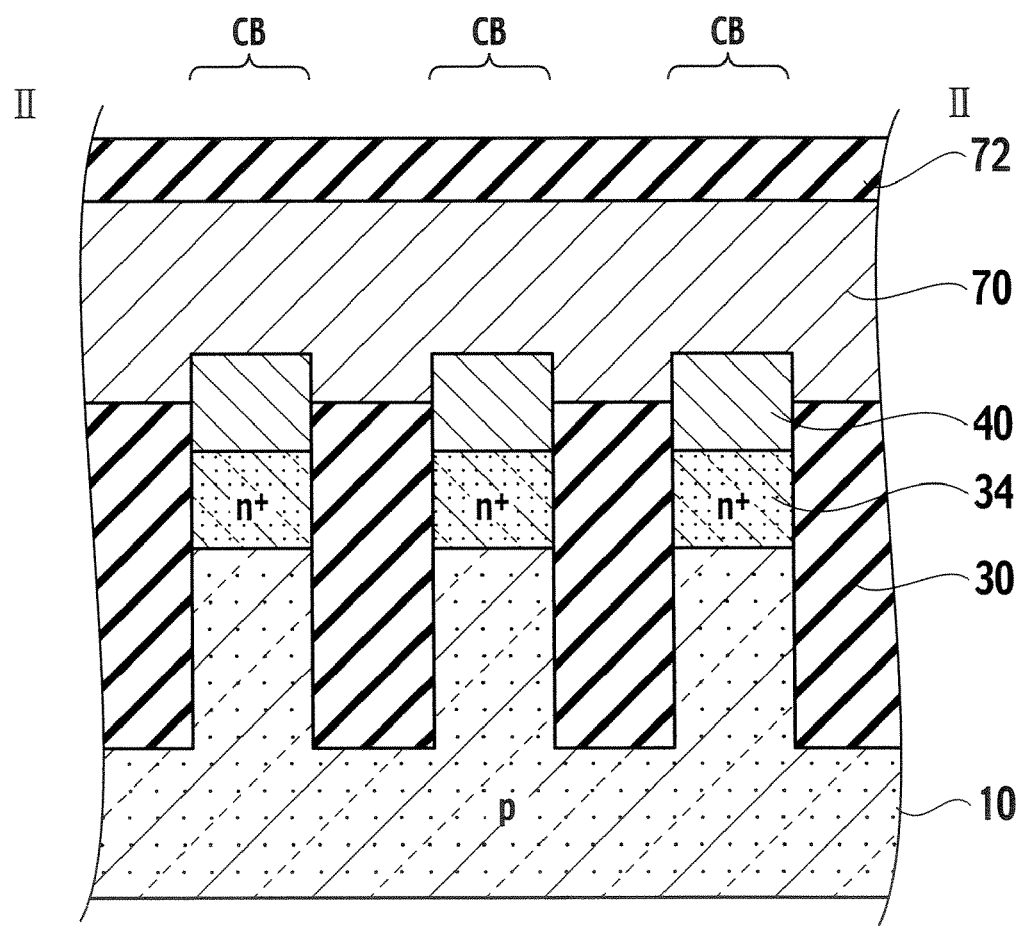
FIG. 6 schematically shows a cross-section of the nonvolatile semiconductor memory, according to the first embodiment of the present invention, cut along the line II-II of FIG. 1 describing a step of the fabrication process thereof.
Figure 7:
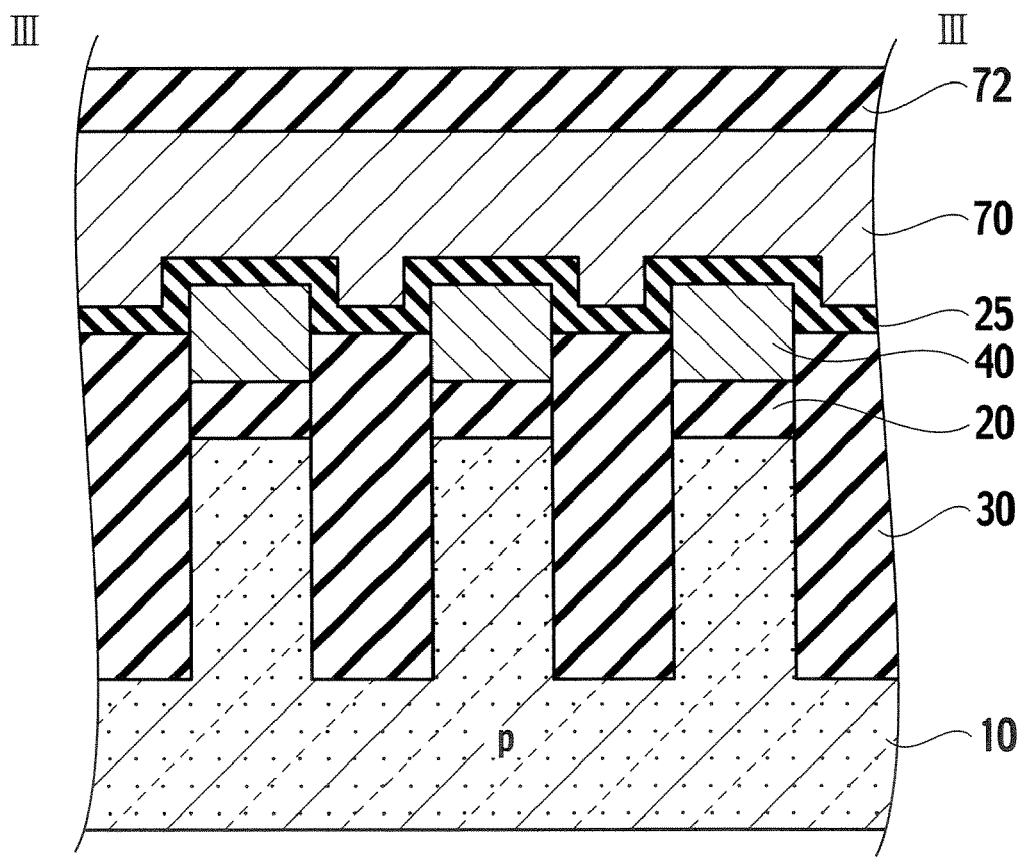
FIG. 7 schematically shows a cross-section of the nonvolatile semiconductor memory, according to the first embodiment of the present invention, cut along the line III-III of FIG. 1 describing a step of the fabrication process thereof.

(d) FIG. 6 schematically shows a cross-section of the nonvolatile semiconductor memory, according to the first embodiment of the present invention, cut along the line II-II of FIG. 1 describing a step of the fabrication process of the nonvolatile semiconductor memory. FIG. 7 schematically shows a cross-section of the nonvolatile semiconductor memory, according to the first embodiment of the present invention, cut along the line III-III of FIG. 1 describing a step of the fabrication process of the nonvolatile semiconductor memory.

Next, as shown in FIGS. 6 and 7, the floating gate electrodes masking material 42 on floating gate electrodes 40 is removed to expose the surface of the floating gate electrodes 40, and the element isolating regions 30 are etched so that the height of the element isolating regions 30 can be lowered than the surface of the floating gate electrodes 40.

At this time, it is important and necessary to optimize the surface area of the exposed floating gate electrodes 40 in the etching process of the element isolating regions 30. Because the value of the capacitive coupling ratio, between the value of the capacitance of the control electrode 70 and the semiconductor substrate 10 to the value of the capacitance between the floating gate electrode 40 and the semiconductor substrate 10, can be adjusted to the value of the capacitive coupling ratio requiring for the write-in/erase operation of the memory cell transistors. Note that the etching process of the element isolating regions 30 may be unnecessary depending on the value of the permittivity of the inter-gate insulating film 25.

Figure 8:
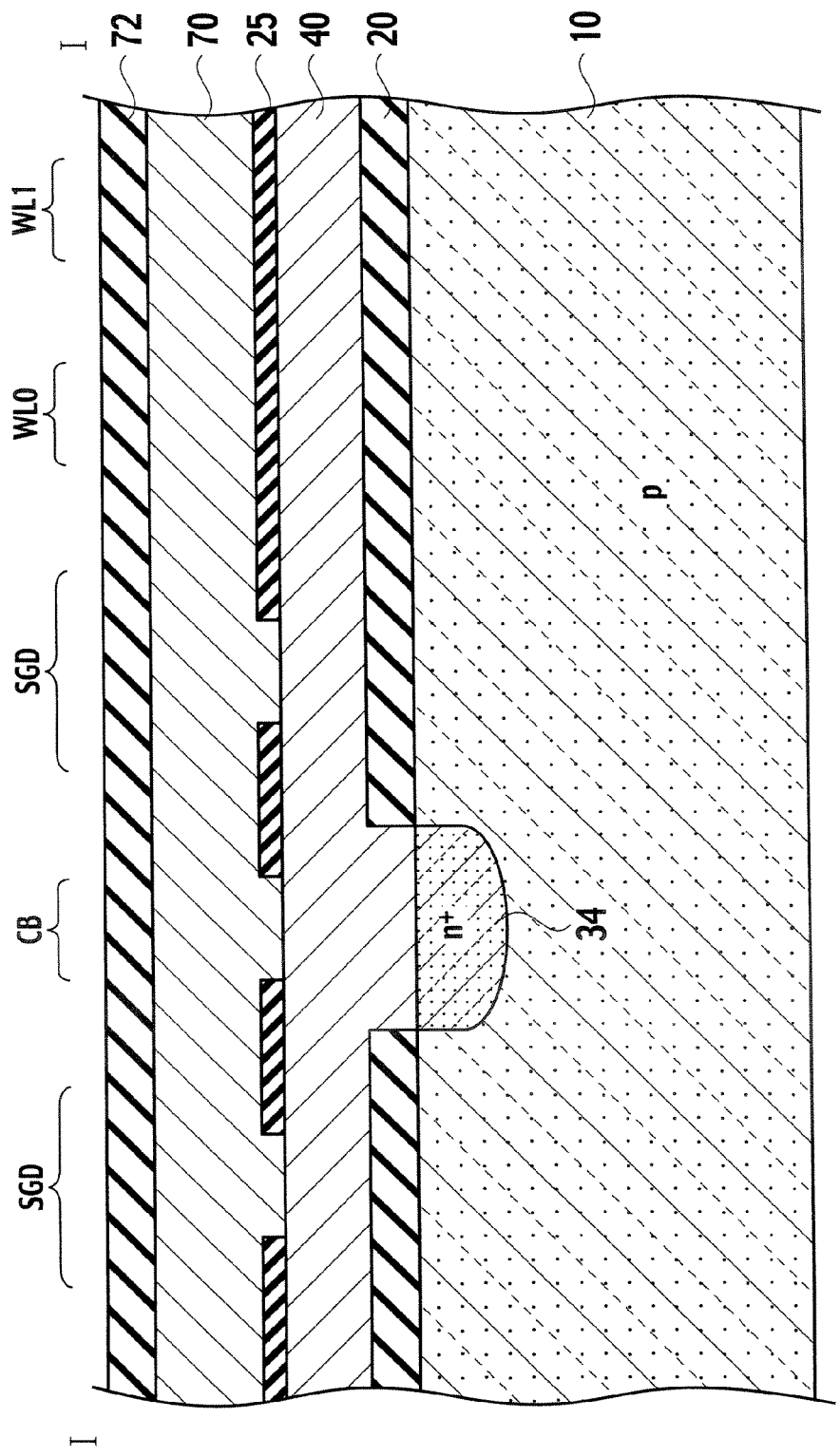
FIG. 8 schematically shows a cross-section of the nonvolatile semiconductor memory, according to the first embodiment of the present invention, cut along the line I-I of FIG. 1 describing a step of the fabrication process thereof.

(e) FIG. 8 schematically shows a cross-section of the nonvolatile semiconductor memory, according to the first embodiment of the present invention, cut along the line I-I of FIG. 1 describing a step of the fabrication process of the nonvolatile semiconductor memory.

Furthermore, as shown in FIGS. 7 and 8, the inter-gate insulating film 25, which is used to insulate the floating gate electrodes 40 of the memory cell transistors from the control gate electrode 70 configured to control write in and erasure, is deposited.

(f) Moreover, as shown in FIG. 8, before deposition of the control gate electrode 70, parts of the inter-gate insulating film 25 for the select gate lines SGD and the bit line contacts CB are removed so that the floating gate electrodes 40 and the control gate electrode 70 form a shape allowing electrical connection. The removed parts of the inter-gate insulating film 25 can extend from the removed parts of select gate lines SGD to the removed parts of adjacent bit line contacts CB, or the removed parts of the inter-gate insulating film 25 can be positioned only on the removed parts of select gate lines SGD and the bit line contacts CB, respectively and independently.

(g) Furthermore, as shown in FIGS. 6, 7, and 8, once the control gate electrode 70 made of, for example, polysilicon or the like is formed across the entire device surface of the semiconductor substrate 10, and then a control gate electrodes masking material 72 made of a nitride film or the like is formed on the control gate electrode 70.

As a result, the control gate electrode 70 is electrically connected to the floating gate electrodes 40 on the forming areas of the plurality of bit line contacts CB, as shown in FIGS. 6 and 8, and the control gate electrode 70 is electrically insulated from the floating gate electrodes 40 on the forming areas of the memory cell transistors via the inter-gate insulating film 25, as shown in FIG. 7.

As a result, FIG. 6 schematically shows a cross-section cut along the line II-II of FIG. 1 after depositing a control gate electrodes masking material 72 on the control gate electrode 70 necessary for subsequent processing steps, and FIG. 7 schematically shows a cross-section cut along the line III-III of FIG. 1 after the same deposition step of the control gate electrodes masking material 72 on the control gate electrode 70. FIG. 8 schematically shows a cross-section cut along the line I-I of FIG. 1 after the same deposition step of the control gate electrodes masking material 72 on the control gate electrode 70.

Figure 9:
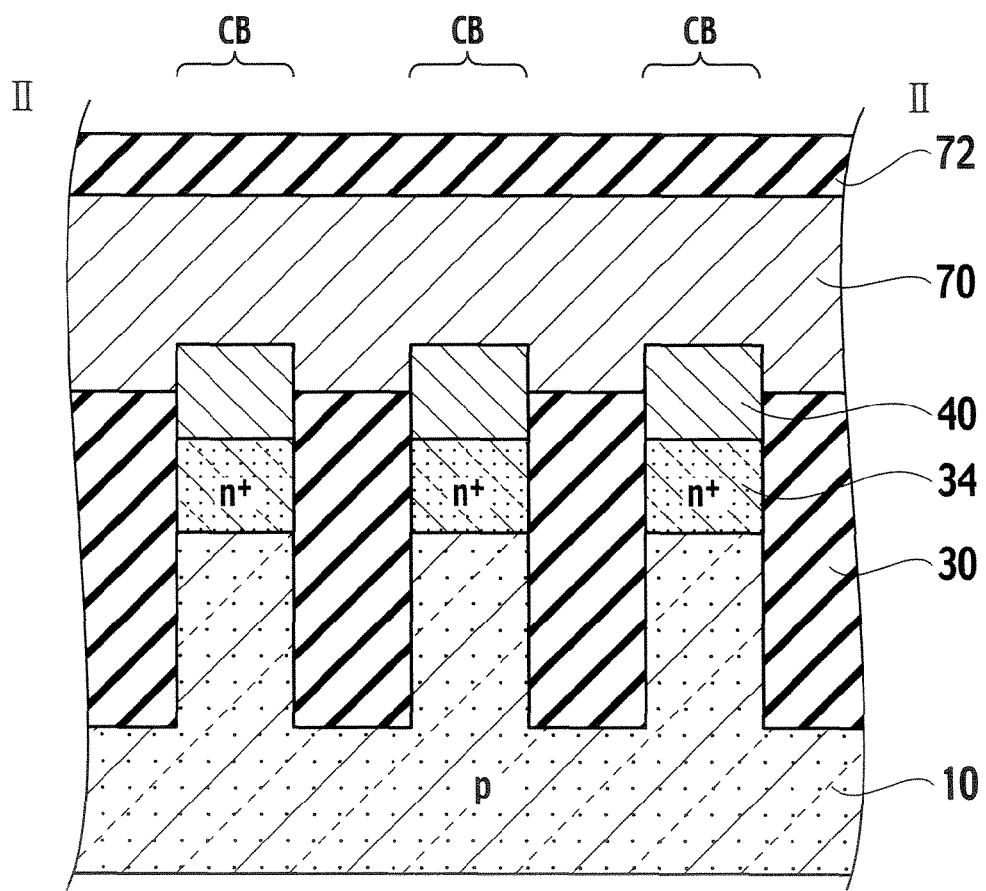
FIG. 9 schematically shows a cross-section of the nonvolatile semiconductor memory, according to the first embodiment of the present invention, cut along the line II-II of FIG. 1 describing a step of the fabrication process thereof.
Figure 10:
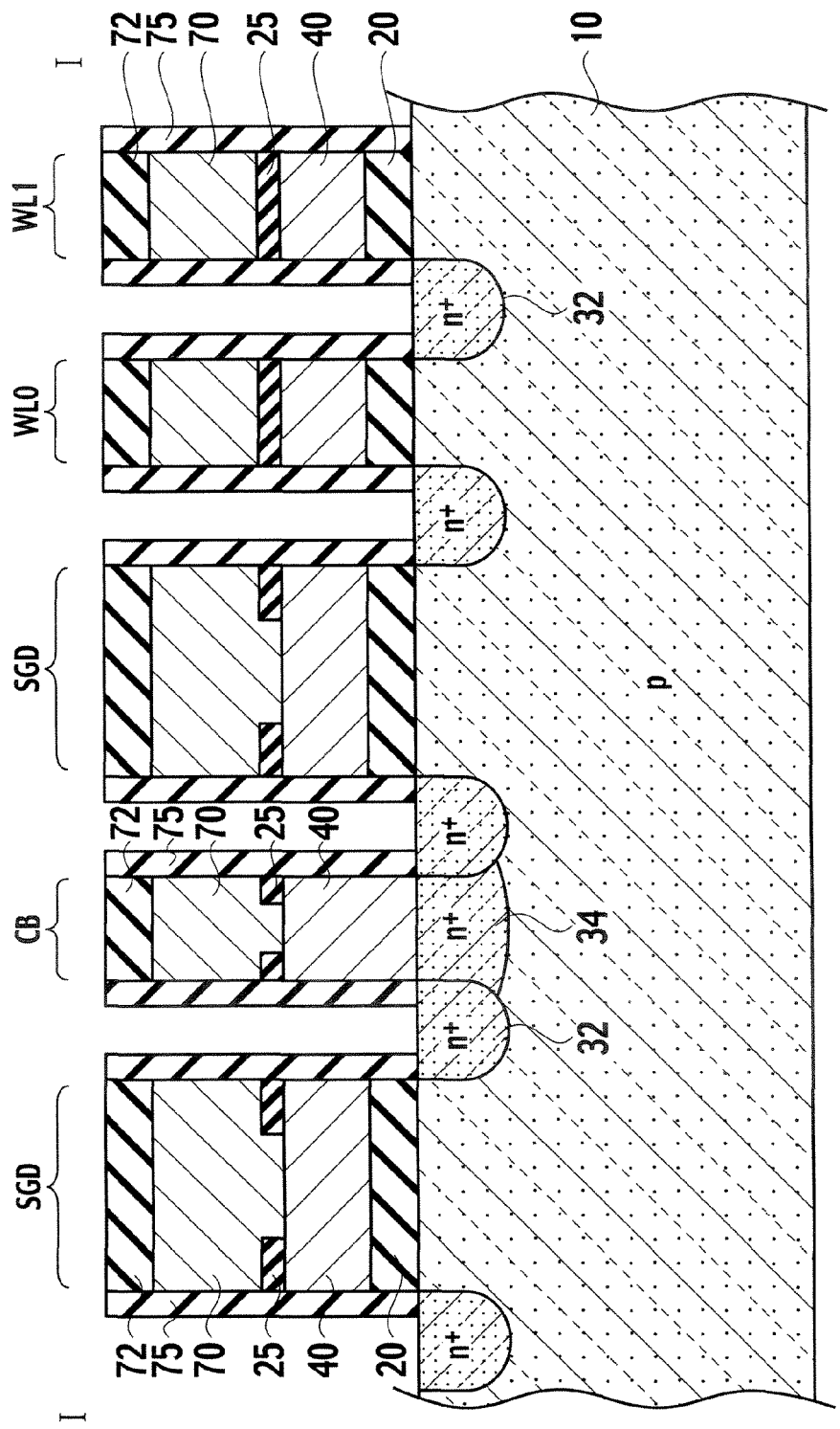
FIG. 10 schematically shows a cross-section of the nonvolatile semiconductor memory, according to the first embodiment of the present invention, cut along the line I-I of FIG. 1 describing a step of the fabrication process thereof.

(h) FIG. 9 schematically shows a cross-section of the nonvolatile semiconductor memory, according to the first embodiment of the present invention, cut along the line II-II of FIG. 1 describing a step of the fabrication process of the nonvolatile semiconductor memory. FIG. 10 schematically shows a cross-section of the nonvolatile semiconductor memory, according to the first embodiment of the present invention, cut along the line I-I of FIG. 1 describing a step of the fabrication process of the nonvolatile semiconductor memory.

Next, as shown in FIGS. 9 and 10, an electrode material, which becomes the word lines WL0, WL1, . . . , the select gate lines SGD-SGD, and the bit line contacts CB, is processed through lithography and etching.

(i) As shown in FIG. 10, necessary impurity ions for forming $n^+$ source/drain diffusion layers 32 of the memory cell transistors are implanted in the semiconductor substrate lousing an ion implantation technique or the like, and then an annealing processing is applied to form the $n^+$ source/drain diffusion layers 32.

Note that the $n^+$ source/drain diffusion layers 32 can be formed, if required for operation, using the ion implantation technique after a gate sidewall material is deposited using gate sidewall insulating films 75, which are insulating films having a high etching selectivity relative to the floating gate electrodes 40 and the control gate electrode 70 or which are made from stacked layers of insulating films having a high etching selectivity, or after the deposited gate sidewall insulating films 75 are etched, as shown in FIG. 10.

As a result, FIG. 9 schematically shows a cross-section cut along the line II-II of FIG. 1 after processing of the electrode material, which becomes the word lines WL0, WL1, ..., the select gate lines SGD-SGD, and the bit line contacts CB, and then formation of the $n^+$ source/drain regions 32, while FIG. 10 schematically shows a cross-section cut along the line I-I of FIG. 1 after the same processing steps of the electrode material.

Figure 11:
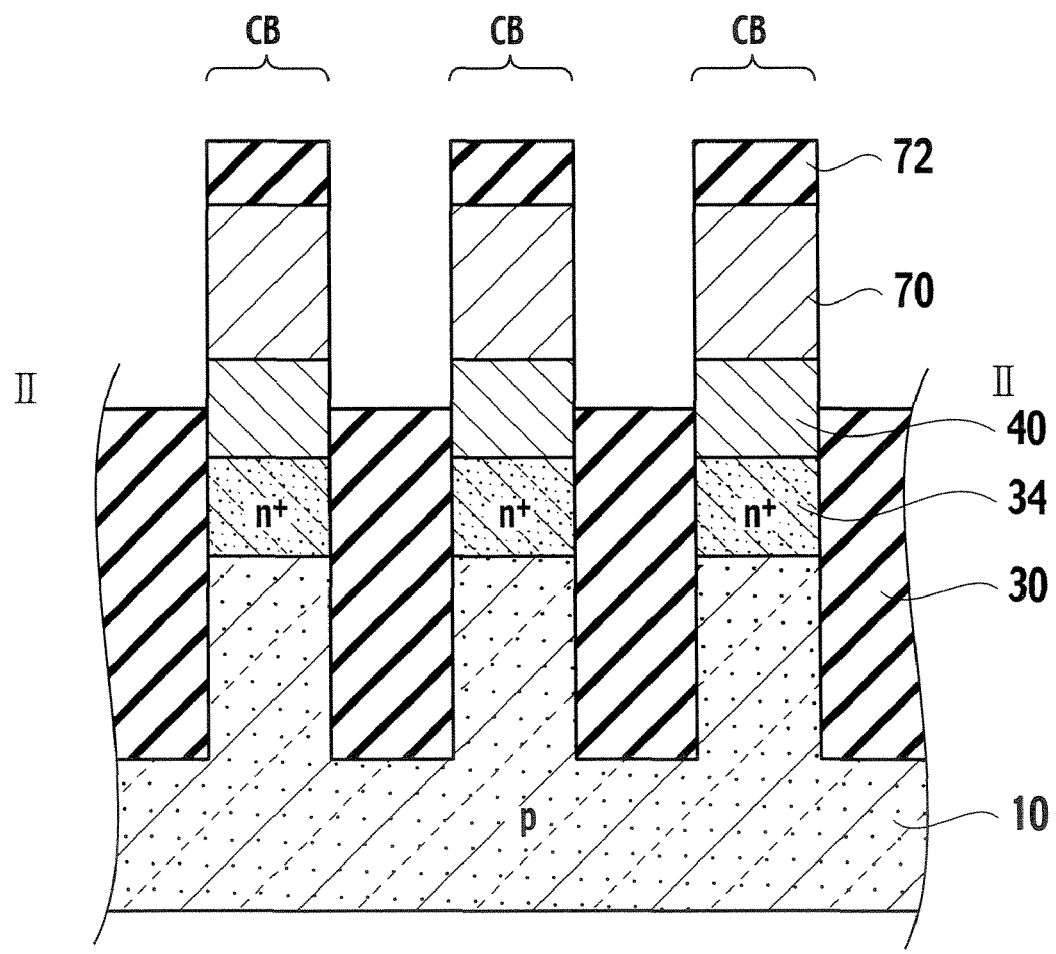
FIG. 11 schematically shows a cross-section of the nonvolatile semiconductor memory, according to the first embodiment of the present invention, cut along the line II-II of FIG. 1 describing a step of the fabrication process thereof.

(j) FIG. 11 schematically shows a cross-section of the nonvolatile semiconductor memory, according to the first embodiment of the present invention, cut along the line II-II of FIG. 1 describing a step of the fabrication process of the nonvolatile semiconductor memory.

Figure 12:
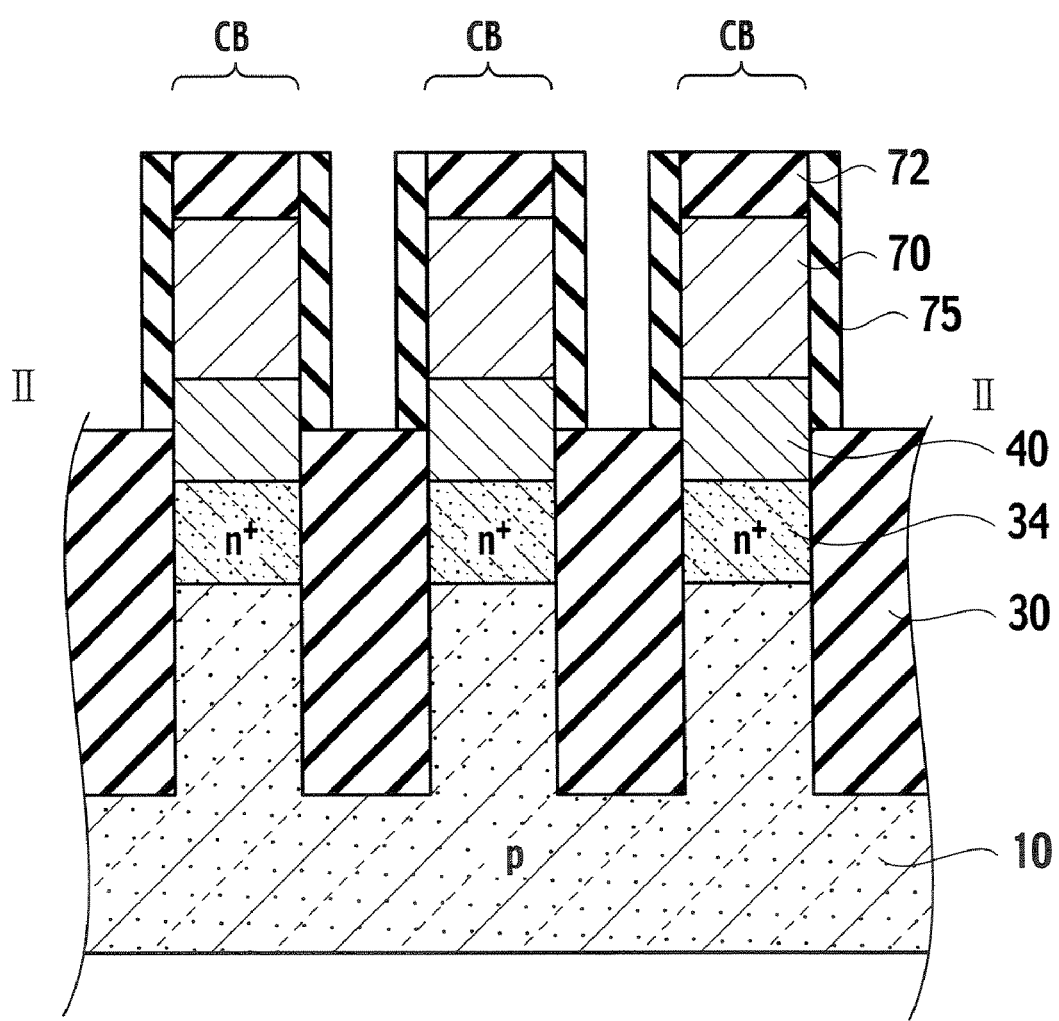
FIG. 12 schematically shows a cross-section of a nonvolatile semiconductor memory, according to a modified example of the first embodiment of the present invention, cut along the line II-II of FIG. 1 describing a step of the fabrication process thereof.

FIG. 12 schematically shows a cross-section of the nonvolatile semiconductor memory, according to a modified example of the first embodiment of the present invention, cut along the line II-II of FIG. 1 describing a step of the fabrication process of the nonvolatile semiconductor memory.

Figure 13:
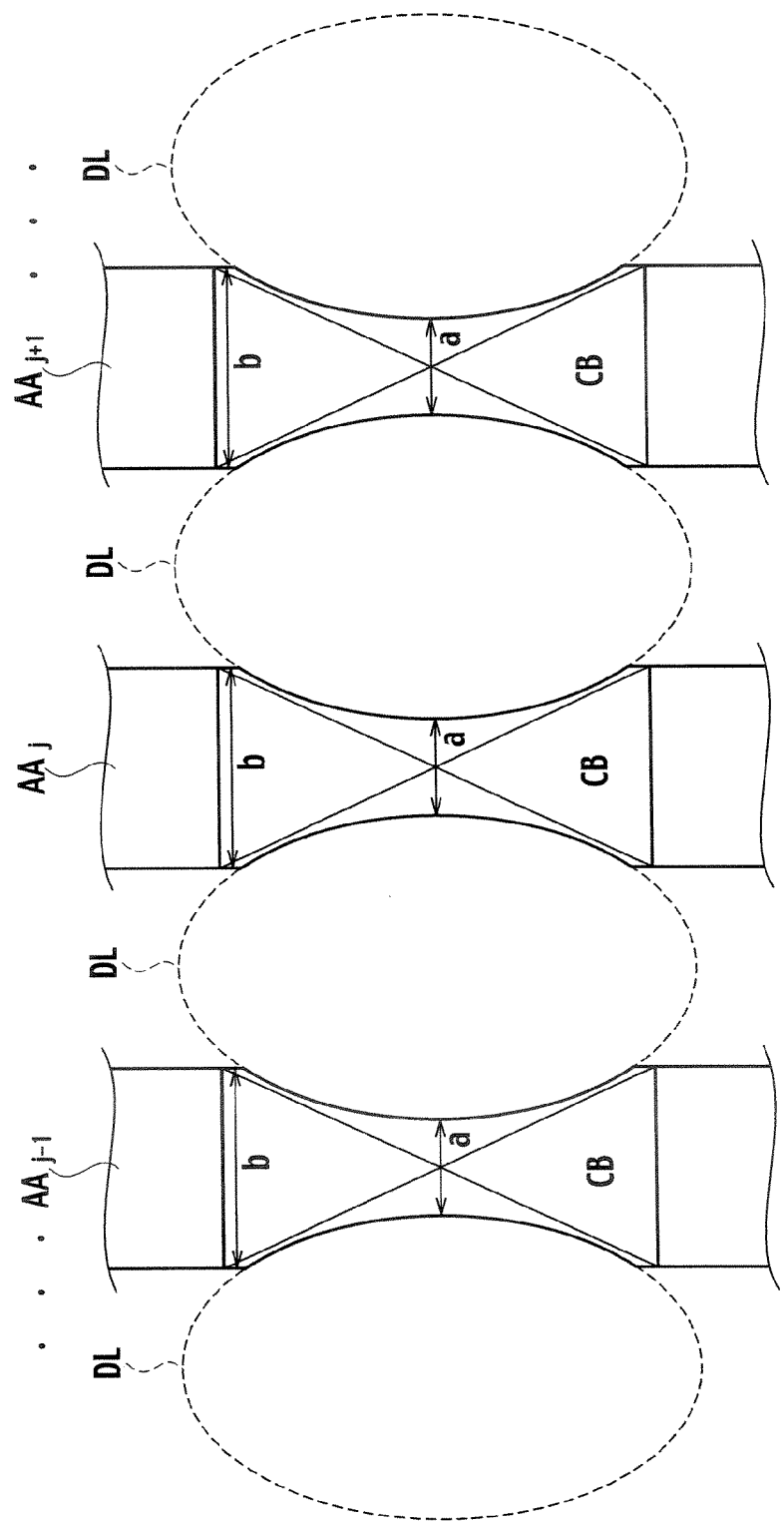
FIG. 13 schematically shows a plan view pattern of the bit line contacts CB regions of the nonvolatile semiconductor memory, according to the first embodiment of the present invention, describing a step of the fabrication process thereof.
Figure 14:
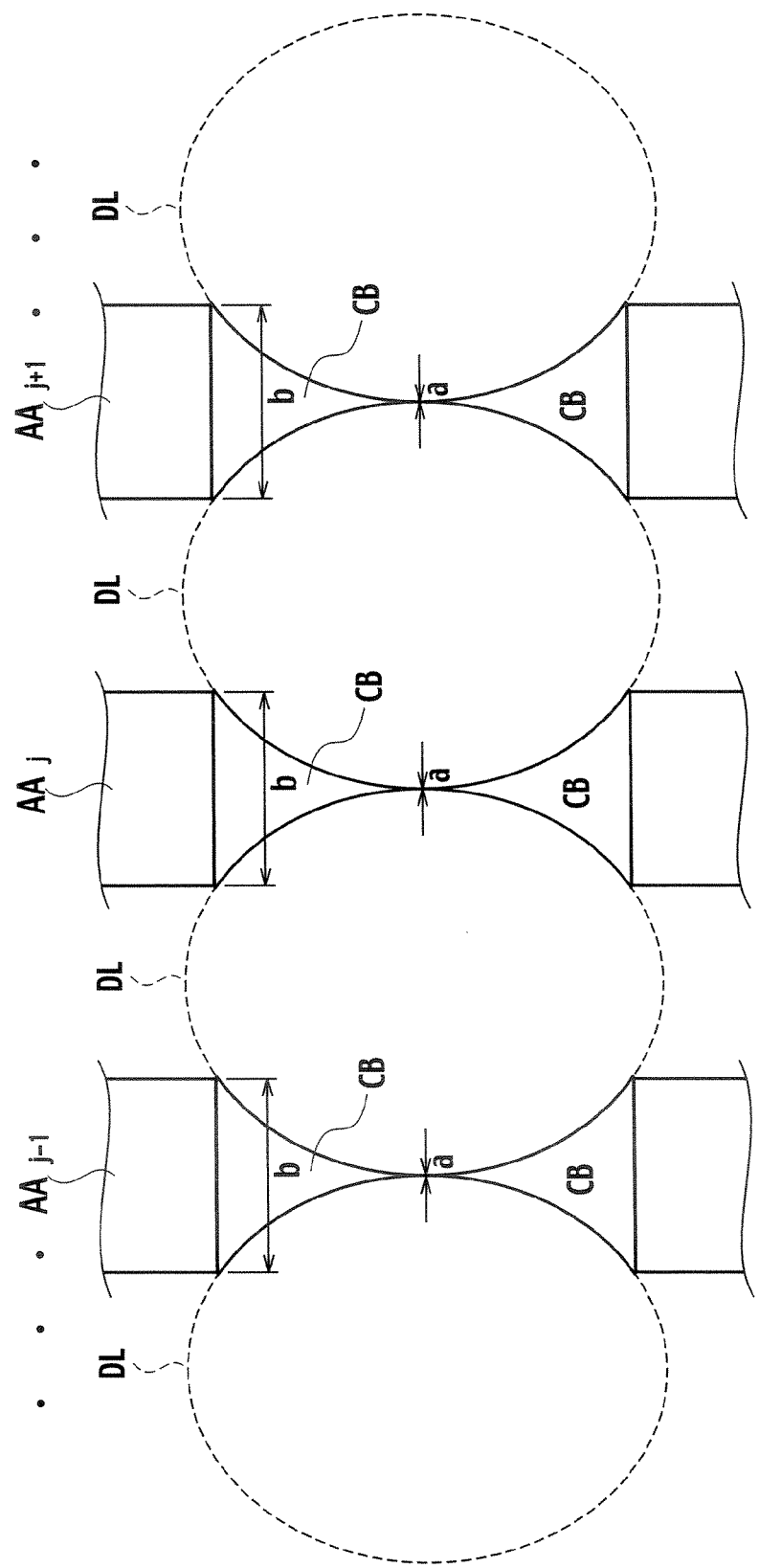
FIG. 14 schematically shows a plan view pattern of the bit line contacts CB regions of the nonvolatile semiconductor memory, according to the first embodiment of the present invention, describing a step of the fabrication process thereof.
Figure 15:
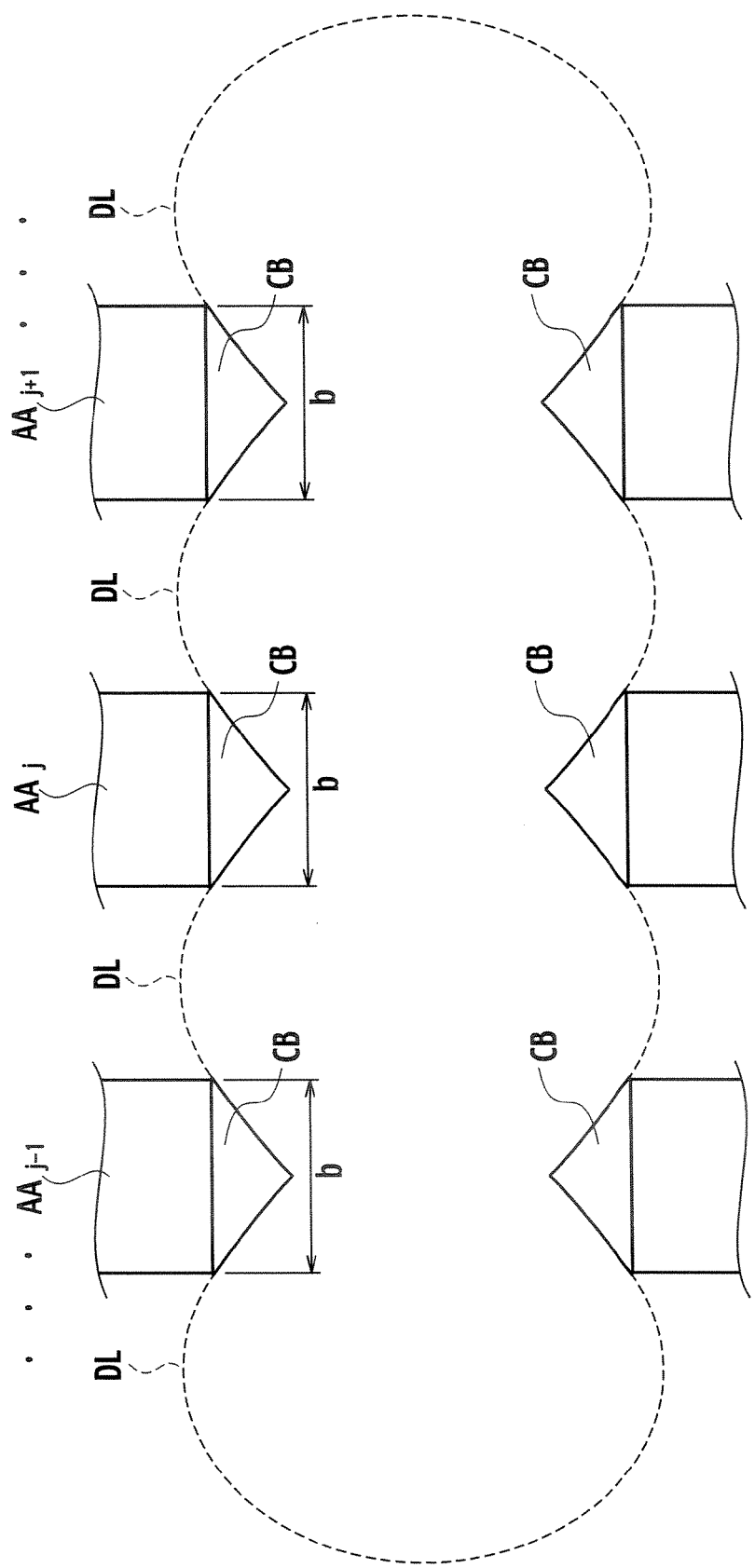
FIG. 15 schematically shows a plan view pattern of the bit line contacts CB regions of the nonvolatile semiconductor memory, according to the first embodiment of the present invention, describing a step of the fabrication process thereof.

Furthermore, FIG. 13 schematically shows a plan view pattern of the bit line contacts CB regions of the nonvolatile semiconductor memory, according to the first embodiment of the present invention, describing a step of the fabrication process. FIG. 14 schematically shows another plan view pattern of the bit line contacts CB regions of the nonvolatile semiconductor memory. FIG. 15 schematically shows yet another plan view pattern of the bit line contacts CB regions of the nonvolatile semiconductor memory.

Next, as shown in FIG. 11, the bit line contacts CB are formed through lithography and etching. Note that the formation of the gate sidewall insulating films 75 and the $n^+$ source/drain diffusion layers 32 described in the above step (i) may be carried out after the bit line contacts CB are formed. FIG. 12 schematically shows a cross-section cut along the line II-II of FIG. 1 where the gate sidewall insulating films 75 and the $n^+$ source/drain diffusion layers 32 are formed after the bit line contacts CB are formed.

FIGS. 13 through 15 schematically shows a plan view pattern after the bit line contacts CB are processed, respectively.

Formation of the bit line contacts CB is described forthwith. The bit line contacts CB are formed by linearly forming the control gate electrode 70 or the electrode material for the bit line contacts CB, as shown in FIG. 9, and then cutting the linearly formed control gate electrode 70 into each of the plurality of bit lines ... $BL_{j-1}$, $BL_j$, $BL_{j+1}$, ... through lithography and etching, as shown in FIGS. 1 and 13 through 15.

As a result, the plurality of bit line contacts CB, which connects the plurality of bit lines ... $BL_{j-1}$, $BL_j$, $BL_{j+1}$, ... and $n^+$ contact diffusion layers 34 in the plurality of active regions ... $AA_{j-1}$, $AA_j$, $AA_{j+1}$, ... of NAND columns, are formed.

In FIGS. 1 and 13 through 15, a plurality of elliptic shaped DL regions enclosed by dotted lines represent regions in which the control gate electrodes 70 or the electrode material for the bit line contacts CB are to be removed through lithography and etching.

FIG. 1 shows the example of the bit line contacts CB formed in rectangular shapes.

In FIG. 13, concave shapes or wasp-waisted shapes enclosed by solid lines and represented by measurements a and b denote bit line contacts CB formed resulting from leaving the control gate electrodes 70 through lithography and etching. Sidewalls of the bit line contacts CB formed in concave shapes or wasp-waisted shapes, when viewed from the top surface, has a recessed sidewall structure in the row direction resulting from the removal of the electrode material for the bit line contacts CB through lithography and etching.

With the bit line contacts CB having the concave, wasp-waisted planar shape, the measurement 'a' represents the shortest measurement in the row direction extending along the word lines, and measurement 'b' represents the longest measurement in the row direction extending along the word lines, as shown in FIG. 13. The measurement 'b' is substantially equal to the width of each of the active regions ... $AA_{j-1}$, $AA_j$, $AA_{j+1}$, .... In FIG. 13, with the bit line contacts CB having the concave, wasp-waisted planar shape, a magnitude relationship between the measurements a and b is represented by 0<a<b, as an example.

FIG. 14 shows an example of a case of a=0, where the size of the elliptic shaped DL regions enclosed by dotted lines becomes larger, and the regions of the control gate electrode 70 or the electrode material for the bit line contacts CB to be etched and removed becomes larger, as compared with the case of a>0.

In FIG. 14, with the bit line contacts CB having the concave, wasp-waisted planar shape, a magnitude relationship between the measurements a and b is represented by 0=a<b.

FIG. 15 shows an example of a case of a<0, where the size of the elliptic shaped DL regions enclosed by dotted lines becomes even larger, and the regions of the control gate electrode 70 or the electrode material for the bit line contacts CB to be etched and removed becomes much larger, as compared with the case of a>0, or the case of a=0. FIG. 15 shows the example of the bit line contacts CB made from two triangular shapes, substantially.

Therefore, at least one of two triangular shaped bit line contacts CB should be left even if removal for another triangular shaped bit line contact CB is carried out through lithography and etching, while FIG. 15 shows an example of the bit line contacts CB made from two triangular shapes substantially.

In an opening processing for the plurality of contact holes, the shape of openings for the contact holes tends to be a circular shape or an elliptic shape depending on conditions of the lithography and etching processes, as the process miniaturization of fine patterns develops.

When processing the bit line contacts CB through a method of forming openings for contact holes and then filling in contact material is used, the magnitude relationship between measurements 'a' and 'b' in the bit line contacts CB shown in FIG. 13, for example, tends to be a>b. As a result, intervals between adjacent bit line contacts CB tend to be smaller since the measurement 'a' of the bit line contacts CB is wider.

A characteristic of the first embodiment of the present invention is that a relationship of a<b is established because the contact material is initially formed into lines and then the contact material between the resulting contacts is removed through lithography and etching. In certain cases, if the value of 'a' is equal to 0 and the value of 'b' is not equal to 0, a sufficient area allowing electrical connection to electrode interconnect wirings of the bit lines ... $BL_{j-1}$, $BL_j$, $BL_{j+1}$, ... in the upper layer can be ensured, because the bit line contacts CB formed resulting from leaving the control gate electrodes 70 through lithography and etching can be electrically connected to a part of underlying active regions ... $AA_{j-1}$, $AA_j$, $AA_{j+1}$, ....

Figure 16:
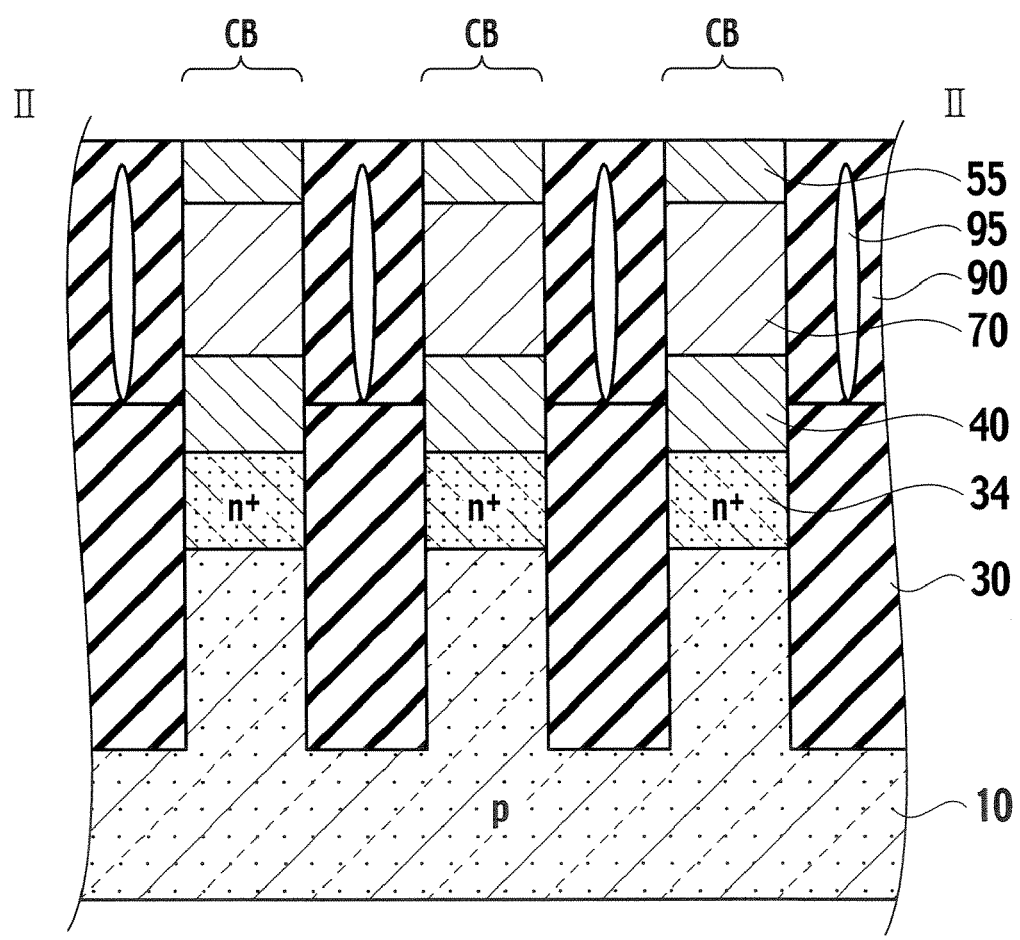
FIG. 16 schematically shows a cross-section of the nonvolatile semiconductor memory, according to the first embodiment of the present invention, cut along the line II-II of FIG. 1 describing a step of the fabrication process thereof.

(k) FIG. 16 schematically shows a cross-section of the nonvolatile semiconductor memory, according to the first embodiment of the present invention, cut along the line II-II of FIG. 1 describing a step of the fabrication process of the nonvolatile semiconductor memory.

Figure 17:
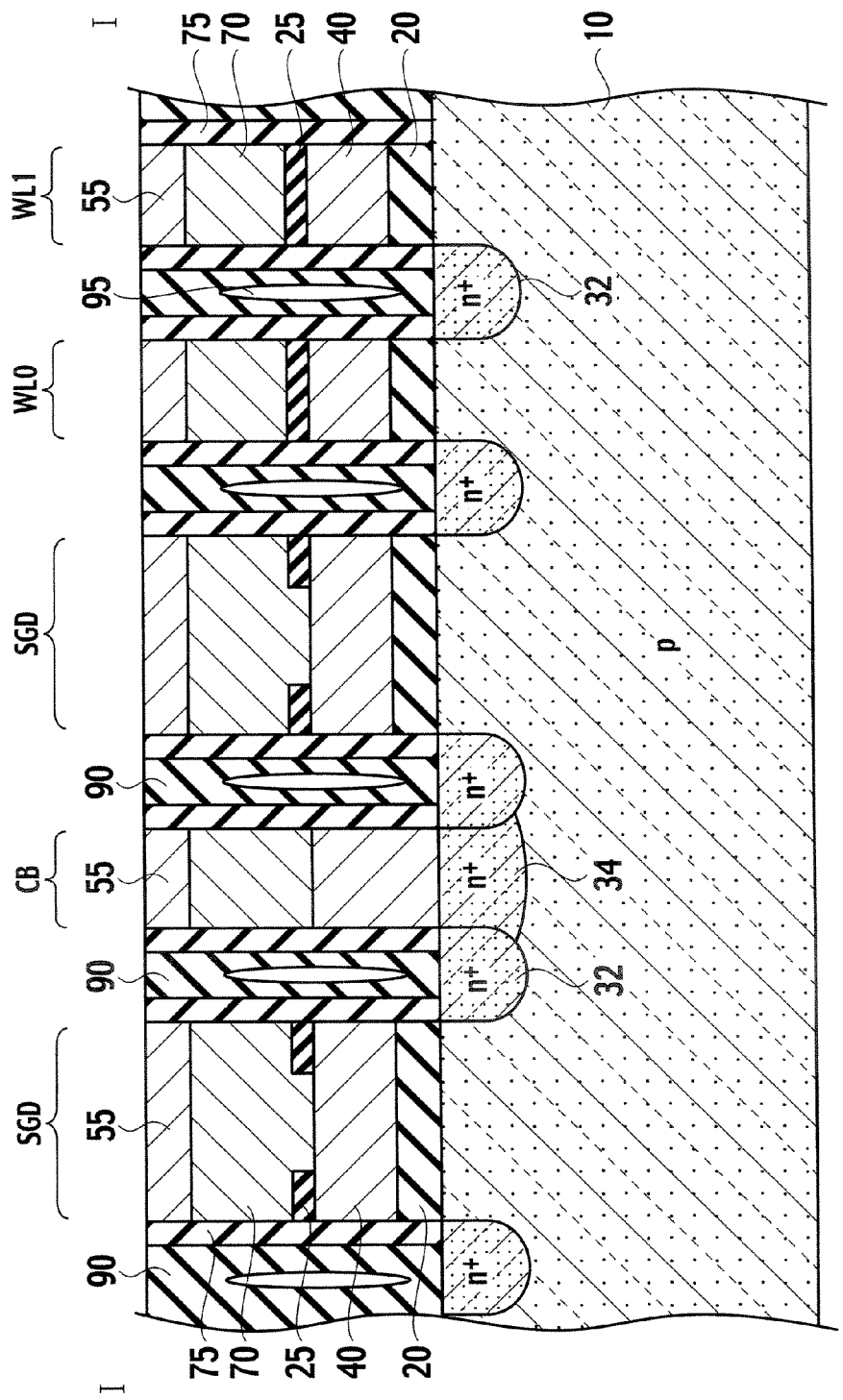
FIG. 17 schematically shows a cross-section of the nonvolatile semiconductor memory, according to the first embodiment of the present invention, cut along the line I-I of FIG. 1 describing a step of the fabrication process thereof.

FIG. 17 schematically shows a cross-section of the nonvolatile semiconductor memory, according to the first embodiment of the present invention, cut along the line I-I of FIG. 1 describing a step of the fabrication process of the nonvolatile semiconductor memory.

Next, as shown in FIGS. 16 and 17, interlayer insulating films 90 are embedded between the adjacent word lines of the plurality of word lines WL0, WL1, . . . , between the select gate line SGD and the word line WL0, between the select gate lines SGD-SGD and the bit line contact CB, and between the adjacent bit line contacts CB, respectively. The interlayer insulating films 90 of the entire device surface are then subjected to a planarization processing, such as the CMP techniques or the like. A tetraetoxysilane (TEOS) film is an example for the interlayer insulating film 90, however the interlayer insulating film 90 can be an insulating film having a stacked structure including an insulating film such as a nitride film having a proper etching selectivity.

It is not necessary for the interlayer insulating films 90 to be completely embedded between the adjacent word lines of the plurality of word lines WL0, WL1, . . . , between the select gate line SGD and the word line WL0, between the select gate lines SGD-SGD and the bit line contacts CB, and between the adjacent bit line contacts CB, respectively. It is required to realize electrical insulations between the adjacent word lines of the plurality of word lines WL0, WL1, . . . , between the select gate line SGD and the word line WL0, between the select gate lines SGD-SGD and the bit line contacts CB, and between the bit line contacts CB, respectively. FIGS. 16 and 17 show a structure in which voids 95 such as holes or gaps exist in the interlayer insulating films 90.

(l) Furthermore, as shown in FIGS. 16 and 17, metallic silicide films 55 are formed on the control gate electrodes 70 after the control gate electrodes masking material 72 on the control gate electrodes 70 is removed and a silicidation processing is performed for the surface of the control gate electrodes 70, so as to achieve low resistivity characteristics for the plurality of word lines WL0, WL1, . . . and the plurality of bit line contacts CB.

Silicide materials, such as cobalt (Co) silicide, nickel (Ni) silicide, titanium (Ti) silicide, tantalum (Ta) silicide, platinum (Pt) silicide, molybdenum (Mo) silicide, tungsten (W) silicide, palladium (Pd) silicide or the like, may be applied for the materials to form the metallic silicide films 55.

In addition to the reduction effect in the aspect ratio of the contact holes, which is realized due to the bit line contacts CB having the stacked structure of the control gate electrodes 70 on the floating gate electrodes 40 shown in FIG. 11, the metallic silicide formation for the bit line contacts CB can be realized in the silicidation processing for the surface of the control gate electrodes 70, and the reduction effects in contact resistances of the bit line contacts CB connecting the upper layer and the lower layer can be also realized without using any additional processing steps.

Thus far, main characteristics and structures of the nonvolatile semiconductor memory, according to the first embodiment of the present invention have been described along with the fabrication method for the nonvolatile semiconductor memory, specifically, the formation method for the plurality of bit line contacts CB for connecting the plurality of bit lines . . . $BL_{j-1}$, $BL_j$, $BL_{j+1}$, . . . and $n^+$ contact diffusion layers 34 in the plurality of active regions . . . $AA_{j-1}$, $AA_j$, $AA_{j+1}$, . . . of NAND columns extending along the column direction. Descriptions for the subsequent processing steps are omitted, since the plurality of bit lines and the interconnect wirings for the peripheral circuits are formed through the typical metallization processing steps for the interconnect wirings and contacts formation.

According to the nonvolatile semiconductor memory and the fabrication method for the same of the first embodiment of the present invention, an electrode material to become bit line contacts CB is formed in a plurality of lines in the row direction, and the electrode material formed in lines is then cut so as to form the bit line contacts CB for the respective bit lines divided in each NAND columns.

The electrode material for the bit line contacts CB is the same material as for the floating gate electrodes 40 and the control gate electrodes 70 of the memory cell transistors and the select gate transistors.

The floating gate electrodes 40 of the memory cell transistors can be formed in the same processing of the floating gate electrodes 40 of the select gate transistors and the control gate electrodes 70 of the memory cell transistors can be formed in the same processing of the control gate electrodes 70 of the select gate transistors.

As a result, according to the nonvolatile semiconductor memory of the first embodiment of the present invention, in the completed device structure, the height of the electrode surfaces, which extend in parallel to the surface of the semiconductor substrate 10 including the bit line contacts CB, from the surface of the semiconductor 10 is substantially the same as the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

According to the nonvolatile semiconductor memory and the fabrication method for the same of the first embodiment of the present invention, contact failures such as short-circuits between adjacent bit lines and contact failures such as electrical-openings of the bit line contacts CB to the element active regions can be avoided so as to improve the production yield.

SECOND EMBODIMENT

Since a plan view pattern structure and a circuit structure of a nonvolatile semiconductor memory according to the second embodiment of the present invention are the same as with the first embodiment, description thereof is omitted. Since the fabrication process of the nonvolatile semiconductor memory, according to the second embodiment of the present invention, uses the same above-given steps (a) through (i) as shown in FIGS. 3 through 10, description thereof is omitted.

Figure 18:
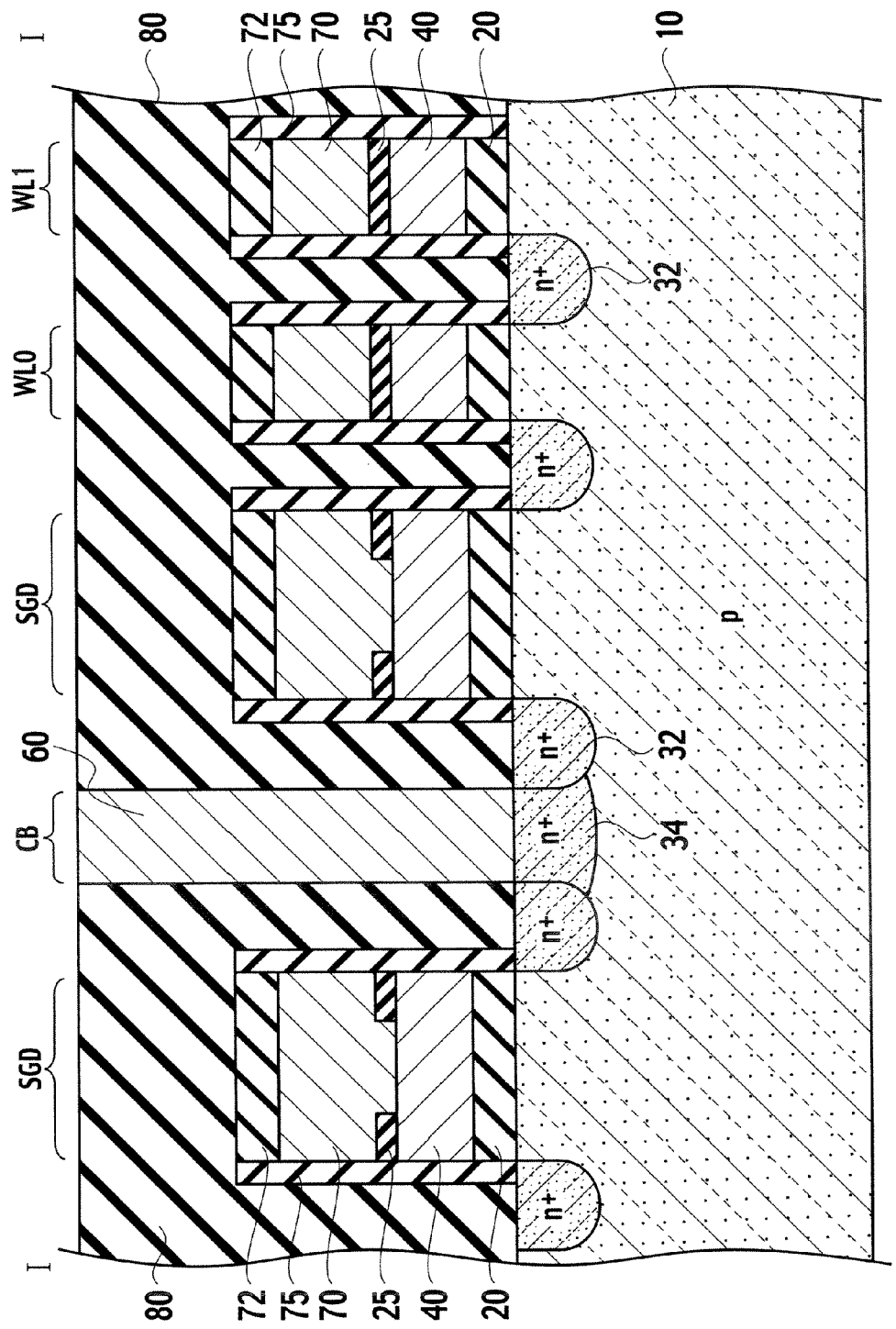
FIG. 18 schematically shows a cross-section of the nonvolatile semiconductor memory, according to the second embodiment of the present invention, cut along the line I-I of FIG. 1 describing a step of a fabrication process thereof.

(m) FIG. 18 schematically shows a cross-section of the nonvolatile semiconductor memory, according to the second embodiment of the present invention, cut along the line I-I of FIG. 1 describing a step of the fabrication process of the nonvolatile semiconductor memory.

After the step (i) as shown in FIG. 10, an interlayer insulating film 80 is deposited across the entire surface of the semiconductor substrate 10, and an electrode material becoming bit line contact (CB) plugs 60 is formed in lines through lithography and etching, as shown in FIG. 18. The material for the bit line contact (CB) plugs 60 is, for example, doped polysilicon or the like, or may be a stacked film of the doped polysilicon and a barrier metal.

(n) Next, the bit line contacts CB are formed through lithography and etching. A schematic plan pattern view after the bit line contacts CB are processed is the same as FIG. 1 or FIGS. 13 through 15.

The bit line contacts CB can be formed in rectangular shapes, as shown in FIG. 1. Alternatively, as shown in FIG. 13, the bit line contacts CB can be formed in concave shapes or wasp-waisted shapes enclosed by solid lines to which are given measurements 'a' and 'b'. Further alternatively, as shown in FIG. 14, the bit line contacts CB can be formed such that a case of a=0, where the size of the elliptic shaped DL regions enclosed by dotted lines becomes larger, and the regions of the control gate electrode 70 or the electrode material for the bit line contacts CB to be etched and removed becomes larger, as compared with the case of a>0. Alternatively, as shown in FIG. 15, the bit line contacts CB can be formed in two triangular shapes, substantially.

The bit line contacts CB should be electrically connected to a part of the underlying active regions ... $AA_{j-1}$, $AA_j$, $AA_{j+1}$, ... through lithography and etching, and should ensure an area allowing electrical connection to the electrode interconnect wirings of the bit lines ... $BL_j$, $BL_j$, $BL_{j+1}$, ... in the upper layer.

Next, as with the first embodiment as shown in FIGS. 16 and 17, interlayer insulating films 90 are embedded between the adjacent word lines of the plurality of word lines WL0, WL1, ..., between the select gate line SGD and the word line WL0, between the select gate lines SGD-SGD and the bit line contact CB, and between the adjacent bit line contacts CB, respectively. The interlayer insulating films 90 of the entire device surface are then subjected to a planarization processing, such as the CMP techniques or the like. A TEOS film is an example for the interlayer insulating film 90, however the interlayer insulating film 90 can be an insulating film having a stacked structure including an insulating film such as a nitride film having a proper etching selectivity.

It is not necessary, as with the first embodiment, for the interlayer insulating films 90 to be completely embedded between the adjacent word lines of the plurality of word lines WL0, WL1, ..., between the select gate line SGD and the word line WL0, between the select gate lines SGD-SGD and the bit line contacts CB, and between the adjacent bit line contacts CB, respectively. It is required to realize electrical insulations between the adjacent word lines of the plurality of word lines WL0, WL1, ..., between the select gate line SGD and the word line WL0, between the select gate lines SGD-SGD and the bit line contacts CB, and between the bit line contacts CB, respectively.

Furthermore, as with the first embodiment, metallic silicide films 55 can be formed on the control gate electrodes 70 after the control gate electrodes masking material 72 on the control gate electrodes 70 is removed and a silicide formation processing is performed for the surface of the control gate electrodes 70, so as to achieve low resistivity characteristics for the plurality of word lines WL0, WL1, ... and the plurality of bit line contacts CB.

Descriptions for the subsequent processing steps are omitted, since the plurality of bit lines and the interconnect wirings for the peripheral circuits are formed through the typical metallization processing steps for the interconnect wirings and contacts formation.

According to the nonvolatile semiconductor memory and the fabrication method for the same of the second embodiment of the present invention, as with the first embodiment, an electrode material to become bit line contacts CB is formed in a plurality of lines in the row direction, and the electrode material formed in lines is then cut so as to form the bit line contacts CB for the respective bit lines divided in each NAND columns. The electrode material for the bit line contacts CB is a different material from the material for the floating gate electrodes 40 and the control gate electrodes 70 of the memory cell transistors and the select gate transistors, because a fabrication processing for the bit line contacts CB is different from the fabrication processing for the floating gate electrodes 40 and the control gate electrodes 70 of the memory cell transistors and the select gate transistors.

As a result, according to the nonvolatile semiconductor memory of the second embodiment of the present invention, in the completed device structure, the height of the electrode surfaces, which extend in parallel to the surface of the semiconductor substrate 10 including the bit line contacts CB, from the surface of the semiconductor 10 is higher than the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

According to the nonvolatile semiconductor memory and the fabrication method for the same of the second embodiment of the present invention, contact failures such as short-circuits between adjacent bit lines and contact failures such as electrical-openings of the bit line contacts CB to the element active regions can be avoided so as to improve the production yield.

With the second embodiment, after the formation processing of the interlayer insulating film 80, the bit line contacts CB can be formed by an etching back processing for the interlayer insulating film 80 until the surface of the control gate (CG) electrodes 70 using a control gate electrodes masking material 72 made of a nitride film or the like as a mask through a CMP processing or the like.

THIRD EMBODIMENT

AND Type

Figure 19:
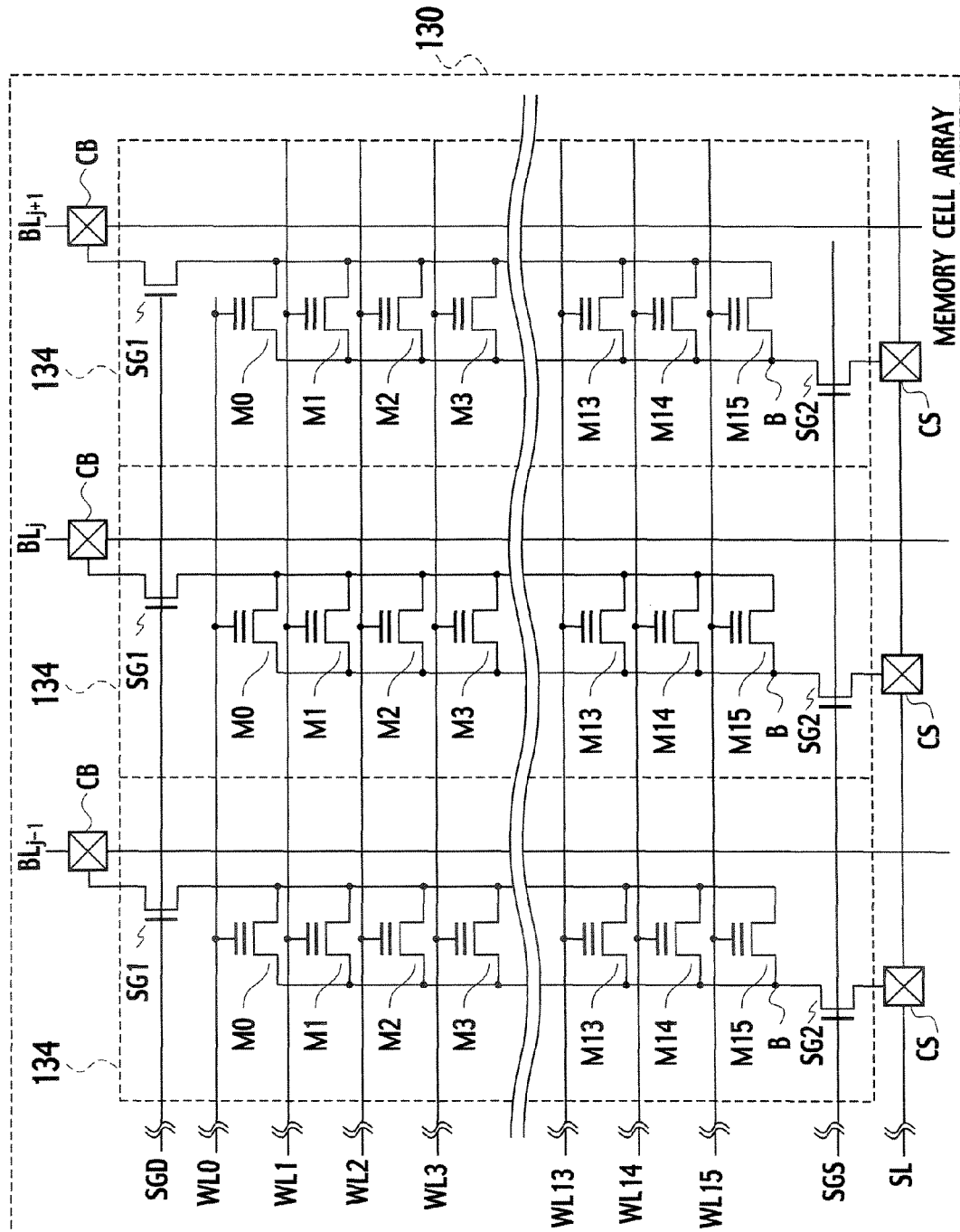
FIG. 19 schematically shows a circuit of a memory cell array in a nonvolatile semiconductor memory according to a third embodiment of the present invention, more specifically, a circuit of an AND memory cell array therein.

As schematically shown in FIG. 19, a circuit structure of a memory cell array 130 in a nonvolatile semiconductor memory according to the third embodiment of the present invention includes an AND memory cell array structure.

Each of AND cell units 134 is constituted by memory cell transistors M0 through M15 connected in parallel and select gate transistors SG1 and SG2, as shown in detail in FIG. 19. The drains of the select gate transistors SG1 are connected to the bit lines ..., $BL_{j-1}$, $BL_j$, $BL_{j+1}$, ... via respective bit line contacts CB, while the sources of the select gate transistors SG2 are connected to the common source line SL via respective source line contacts CS.

In FIG. 19, the numeral of 134 denotes the AND cell units enclosed by dotted lines. Within each of the AND cell units 134, the drain regions of respective memory cell transistors M0 through M15 are connected in common, and the source regions of respective memory cell transistors M0 through M15 are also connected in common. In other words, with each of the AND cell units 134 in the AND flash memory shown in FIG. 19, the memory cell transistors M0 through M15 are connected in parallel, a bit line side select transistor SG1 is connected to one side of the memory cell transistors M0 through M15, and a source line side select transistor SG2 is connected to the other side of the memory cell transistors M0 through M15. Word lines WL0 through WL15 are connected one-on-one to the gates of the respective memory cell transistors M0 through M15. A select gate line SGD is connected to the gate of the bit line side select transistor SG1. A select gate line SGS is connected to the gate of the source line side select transistor SG2.

According to the nonvolatile semiconductor memory and the fabrication method for the same of the third embodiment of the present invention, an electrode material to become bit line contacts CB is formed in a plurality of lines in the row direction, and the electrode material formed in lines is then cut so as to form the bit line contacts CB for the respective bit lines divided in each AND columns.

As with the first embodiment, the electrode material for the bit line contacts CB is the same material as for the floating gate electrodes 40 and the control gate electrodes 70 of the memory cell transistors and the select gate transistors.

The floating gate electrodes 40 of the memory cell transistors can be formed in the same processing of the floating gate electrodes 40 of the select gate transistors and the control gate electrodes 70 of the memory cell transistors can be formed in the same processing of the control gate electrodes 70 of the select gate transistors.

As a result, according to the nonvolatile semiconductor memory of the third embodiment of the present invention, in the completed device structure, the height of the electrode surfaces, which extend in parallel to the surface of the semiconductor substrate 10 including the bit line contacts CB, from the surface of the semiconductor 10 is substantially the same as the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

Alternatively, as with the second embodiment, the electrode material for the bit line contacts CB can be a different material from the material for the floating gate electrodes 40 and the control gate electrodes 70 of the memory cell transistors and the select gate transistors, because a fabrication processing for the bit line contacts CB can be different from the fabrication processing for the floating gate electrodes 40 and the control gate electrodes 70 of the memory cell transistors and the select gate transistors.

As a result, according to the nonvolatile semiconductor memory of the third embodiment of the present invention, in the completed device structure, the height of the electrode surfaces, which extend in parallel to the surface of the semiconductor substrate 10 including the bit line contacts CB, from the surface of the semiconductor 10 can be higher than the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

According to the nonvolatile semiconductor memory and the fabrication method for the same of the third embodiment of the present invention, contact failures such as short-circuits between adjacent bit lines and contact failures such as electrical-openings of the bit line contacts CB to the element active regions in the AND flash memory, can be avoided so as to improve the production yield.

FOURTH EMBODIMENT

NOR Structure

Figure 20:
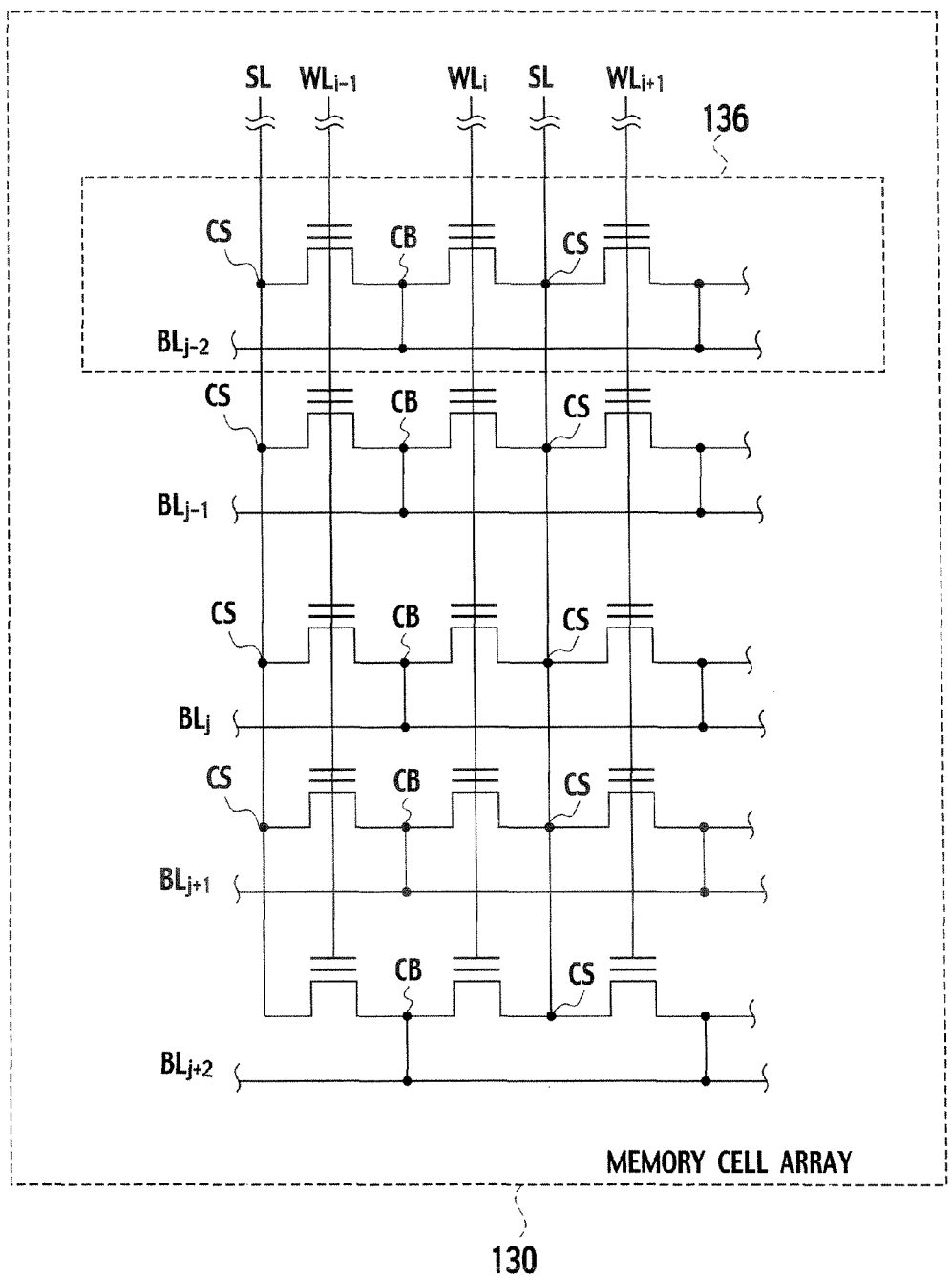
FIG. 20 schematically shows a circuit of a memory cell array in a nonvolatile semiconductor memory, according to a fourth embodiment of the present invention, more specifically, a circuit of a NOR memory cell array therein.

As schematically shown in FIG. 20, a circuit structure of a memory cell array 130 in a nonvolatile semiconductor memory according to the fourth embodiment of the present invention includes a NOR memory cell array structure.

In FIG. 20, the numeral of 136 denotes a NOR cell unit enclosed by a dotted line. Within each of a plurality of NOR cell units 136, the common source region of two adjacent memory cell transistors is connected to a source line SL via a source line contact CS, and the common drain region is connected to bit lines . . . $BL_{j-2}$, $BL_{j-1}$, $BL_j$, $BL_{j+1}$, $BL_{j+2}$, . . . via bit line contacts CB. Furthermore, the NOR cell units 136 are aligned in parallel to the row direction extending along the plurality of word lines . . . , $WL_{i-1}$, $WL_i$, $WL_{i+1}$, . . . perpendicular to the plurality of bit lines . . . $BL_{j-2}$, $BL_{j-1}$, $BL_j$, $BL_{j+1}$, $BL_{j+2}$, . . . . The respective word lines . . . , $WL_{i-1}$, $WL_i$, $WL_{i+1}$, . . . are connected to the gates of respective memory cell transistors among NOR cell units 136. The nonvolatile semiconductor memory having the NOR circuit structure has a characteristic allowing higher-speed read out than with the NAND structure.

According to the nonvolatile semiconductor memory and the fabrication method for the same of the fourth embodiment of the present invention, an electrode material to become bit line contacts CB is formed in a plurality of lines in the row direction, and the electrode material formed in lines is then cut so as to form the bit line contacts CB for the respective bit lines divided in each NOR cell unit columns.

As with the first embodiment, the electrode material for the bit line contacts CB is the same material as for the floating gate electrodes 40 and the control gate electrodes 70 of the memory cell transistors and the select gate transistors.

The floating gate electrodes 40 of the memory cell transistors can be formed in the same processing of the floating gate electrodes 40 of the select gate transistors and the control gate electrodes 70 of the memory cell transistors can be formed in the same processing of the control gate electrodes 70 of the select gate transistors.

As a result, according to the nonvolatile semiconductor memory of the fourth embodiment of the present invention, in the completed device structure, the height of the electrode surfaces, which extend in parallel to the surface of the semiconductor substrate 10 including the bit line contacts CB, from the surface of the semiconductor 10 is substantially the same as the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

Alternatively, as with the second embodiment, the electrode material for the bit line contacts CB can be a different material from the material for the floating gate electrodes 40 and the control gate electrodes 70 of the memory cell transistors and the select gate transistors, because a fabrication processing for the bit line contacts CB can be different from the fabrication processing for the floating gate electrodes 40 and the control gate electrodes 70 of the memory cell transistors and the select gate transistors.

As a result, according to the nonvolatile semiconductor memory of the fourth embodiment of the present invention, in the completed device structure, the height of the electrode surfaces, which extend in parallel to the surface of the semiconductor substrate 10 including the bit line contacts CB, from the surface of the semiconductor 10 can be higher than the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

According to the nonvolatile semiconductor memory and the fabrication method for the same of the fourth embodiment of the present invention, contact failures such as short-circuits between adjacent bit lines and contact failures such as electrical-openings of the bit line contacts CB to the element active regions in the NOR flash memory, can be avoided so as to improve the production yield.

FIFTH EMBODIMENT

Two-Transistor/Cell Type

Figure 21:
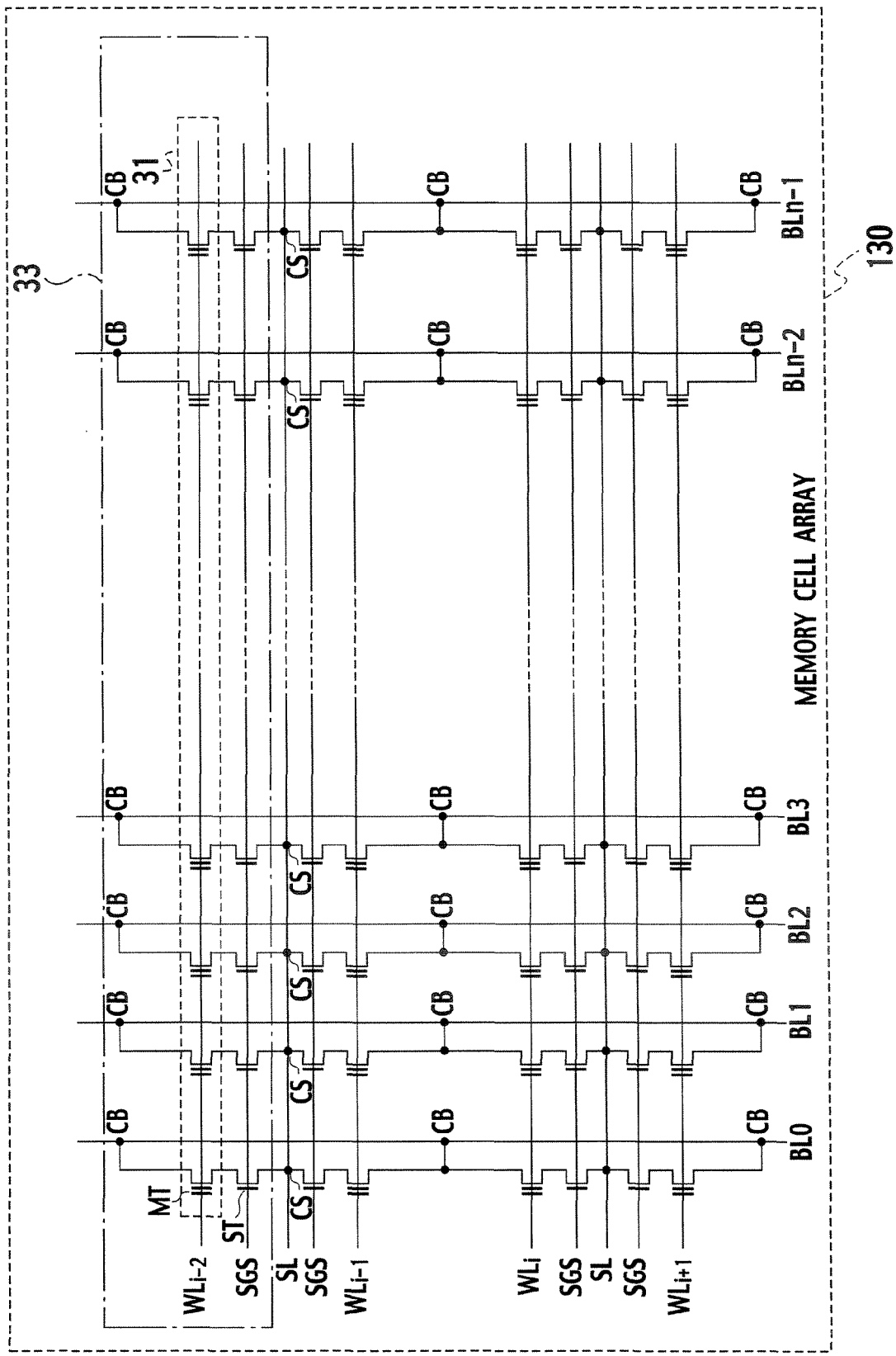
FIG. 21 schematically shows a circuit of a memory cell array in a nonvolatile semiconductor memory, according to a fifth embodiment of the present invention, more specifically a circuit of a two-transistor/cell memory cell array therein.

As schematically shown in FIG. 21, a circuit structure of a memory cell array 130 in a nonvolatile semiconductor memory according to the fifth embodiment of the present invention includes a two-transistor/cell type memory cell array structure.

The nonvolatile semiconductor memory according to the fifth embodiment of the present invention has a two-transistor/cell structure as a basic structure, including memory cells, each with a stacked gate structure made up of a gate insulating film 20 as a tunneling insulating film formed on a p-well or semiconductor substrate 10, and a floating gate electrode 40, an inter-gate insulating film 25, and a control gate electrode 70 further disposed on the inter-gate insulating film 25. The drain region of n+ source/drain regions 32 of a memory cell transistor MT is connected to a bit line contact CB, while the source region of the memory cell transistor MT is connected to the drain region of a select transistor ST. In addition, source regions of the respective select transistors ST are connected to respective source line contacts CS. Such two-transistor/cell type memory cells are arranged in parallel to the row direction extending along the plurality of word lines and as shown in FIG. 21, constituting a memory cell block 33. In a single memory cell block 33, the word line $WL_{i-2}$ is connected in common to control gate electrodes of respective memory cells, constituting a page unit 31. Note that pages within a plurality of blocks may naturally be grouped into a page unit. Furthermore, a select gate line SGS is connected in common to the gate electrodes of the select transistors ST. Meanwhile, a circuit structure having two-transistor/cell type memory cells symmetrically arranged with the source line SL as a line of symmetry is arranged in series in the column direction extending along the plurality of bit lines BL0, BL1, BL2, . . . , BLn−1.

The semiconductor memory according to the fifth embodiment of the present invention can have an intermediate function between the highly integrated NAND type and the high-speed NOR type.

According to the nonvolatile semiconductor memory and the fabrication method for the same of the fifth embodiment of the present invention, an electrode material to become bit line contacts CB is formed in a plurality of lines in the row direction and the electrode material formed in lines is then cut so as to form the bit line contacts CB for the respective bit lines divided CB in each two-transistor/cell columns.

As with the first embodiment, the electrode material for the bit line contacts CB is the same material as for the floating gate electrodes 40 and the control gate electrodes 70 of the memory cell transistors and the select gate transistors.

The floating gate electrodes 40 of the memory cell transistors can be formed in the same processing of the floating gate electrodes 40 of the select gate transistors and the control gate electrodes 70 of the memory cell transistors can be formed in the same processing of the control gate electrodes 70 of the select gate transistors.

As a result, according to the nonvolatile semiconductor memory of the fifth embodiment of the present invention, in the completed device structure, the height of the electrode surfaces, which extend in parallel to the surface of the semiconductor substrate 10 including the bit line contacts CB, from the surface of the semiconductor 10 is substantially the same as the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

Alternatively, as with the second embodiment, the electrode material for the bit line contacts CB can be a different material from the material for the floating gate electrodes 40 and the control gate electrodes 70 of the memory cell transistors and the select gate transistors, because a fabrication processing for the bit line contacts CB can be different from the fabrication processing for the floating gate electrodes 40 and the control gate electrodes 70 of the memory cell transistors and the select gate transistors.

As a result, according to the nonvolatile semiconductor memory of the fifth embodiment of the present invention, in the completed device structure, the height of the electrode surfaces, which extend in parallel to the surface of the semiconductor substrate 10 including the bit line contacts CB, from the surface of the semiconductor 10 can be higher than the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

According to the nonvolatile semiconductor memory and the fabrication method for the same of the fifth embodiment of the present invention, contact failures such as short-circuits between adjacent bit lines and contact failures such as electrical-openings of the bit line contacts CB to the element active regions in the two-transistor/cell flash memory, can be avoided so as to improve the production yield.

SIXTH EMBODIMENT

Three-Transistor/Cell Type

Figure 22:
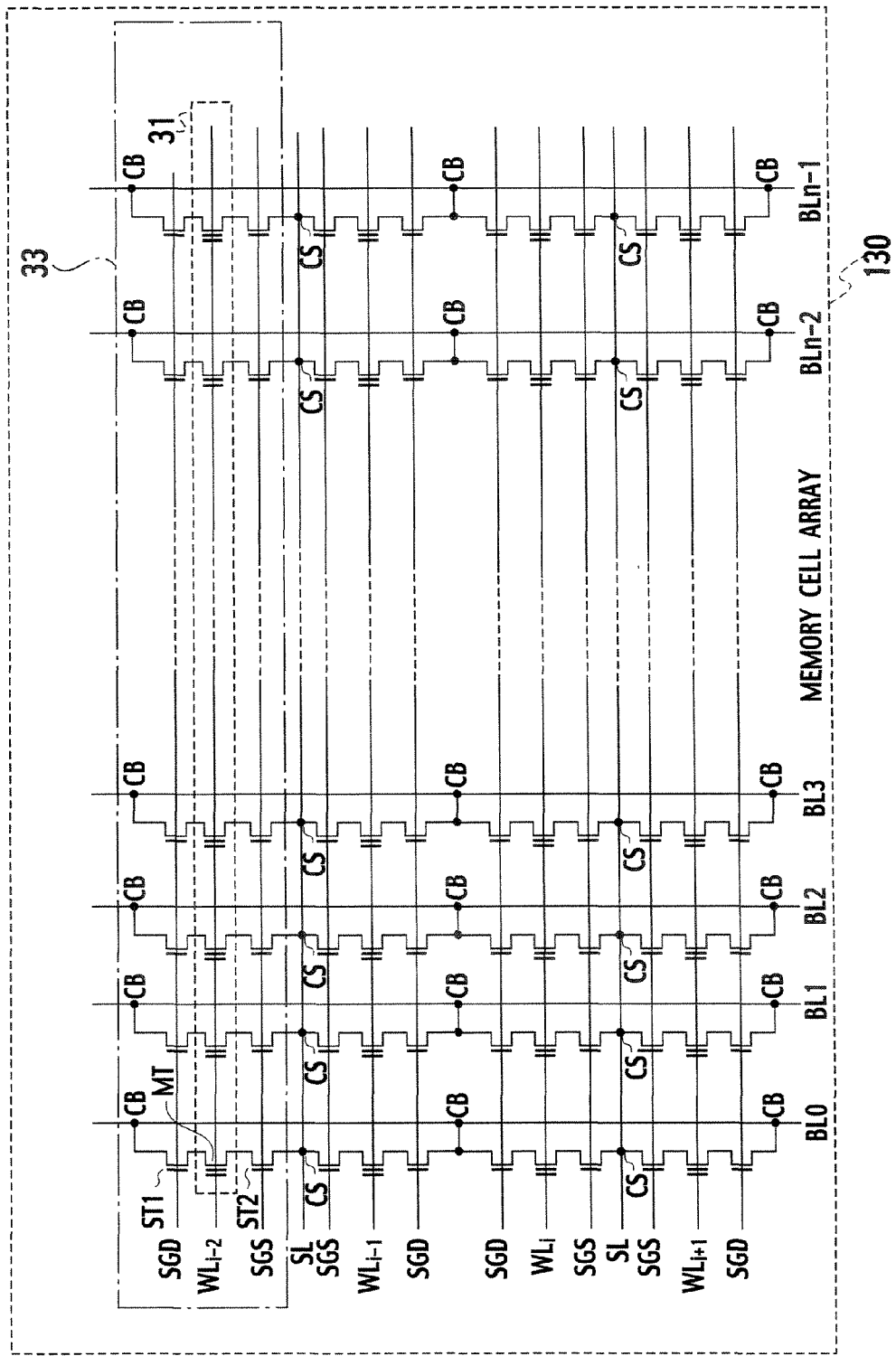
FIG. 22 schematically shows a circuit of a memory cell array in a nonvolatile semiconductor memory, according to a sixth embodiment of the present invention, more specifically, a circuit of a three-transistor/cell memory cell array region therein.

As schematically shown in FIG. 22, a circuit structure of a memory cell array 130 in nonvolatile semiconductor memory according to the sixth embodiment of the present invention includes a three-transistor/cell type memory cell array structure.

The nonvolatile semiconductor memory according to the sixth embodiment of the present invention has a three-transistor/cell structure as a basic structure, including memory cell transistors MT, each with a stacked gate structure made up of a gate insulating film 20 as a tunneling insulating film formed on a p-well or semiconductor substrate 10, and a floating gate electrode 40, an inter-gate insulating film 25, and a control gate electrode 70 further disposed on the inter-gate insulating film 25, where select transistors ST1 and ST2 are disposed on either side of the memory cell transistors MT. The drain region of the memory cell transistor MT is connected to a bit line contact CB via the bit line side select transistor ST1, while the source region is connected to a source line contact CS via the source line side select transistor ST2. Such three-transistor/cell type memory cells are arranged in parallel to the row direction extending along the plurality of word lines and, as shown in FIG. 22, constitute a memory cell block 33. In a single memory cell block 33, the word line $WL_{i-2}$ is connected in common to control gate electrodes of respective memory cell transistors MT, constituting a page unit 31. Note that pages within a plurality of blocks may naturally be grouped into a page unit. Furthermore, a select gate line SGS is connected in common to the gate electrodes of the source line side select transistors ST2, and a select gate line SGD is connected in common to the gate electrodes of the bit line side select transistors ST1. Meanwhile, a circuit structure having three-transistor/cell type memory cells symmetrically arranged with the source line SL as a line of symmetry is arranged in series in the column direction extending along the plurality of bit lines BL0, BL1, BL2, . . . , BLn–1.

The semiconductor memory according to the sixth embodiment of the present invention can have intermediate functions between the highly integrated NAND type and the high-speed NOR type.

According to the nonvolatile semiconductor memory and the fabrication method for the same of the sixth embodiment of the present invention, an electrode material to become bit line contacts CB is formed in a plurality of lines in the row direction, and the electrode material formed in lines is then cut so as to form the bit line contacts CB for the respective bit lines divided CB in each three-transistor/cell columns.

As with the first embodiment, the electrode material for the bit line contacts CB is the same material as for the floating gate electrodes 40 and the control gate electrodes 70 of the memory cell transistors and the select gate transistors.

The floating gate electrodes 40 of the memory cell transistors can be formed in the same processing of the floating gate electrodes 40 of the select gate transistors and the control gate electrodes 70 of the memory cell transistors can be formed in the same processing of the control gate electrodes 70 of the select gate transistors.

As a result, according to the nonvolatile semiconductor memory of the sixth embodiment of the present invention, in the completed device structure, the height of the electrode surfaces, which extend in parallel to the surface of the semiconductor substrate 10 including the bit line contacts CB, from the surface of the semiconductor 10 is substantially the same as the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

Alternatively, as with the second embodiment, the electrode material for the bit line contacts CB can be a different material from the material for the floating gate electrodes 40 and the control gate electrodes 70 of the memory cell transistors and the select gate transistors, because a fabrication processing for the bit line contacts CB can be different from the fabrication processing for the floating gate electrodes 40 and the control gate electrodes 70 of the memory cell transistors and the select gate transistors.

As a result, according to the nonvolatile semiconductor memory of the sixth embodiment of the present invention, in the completed device structure, the height of the electrode surfaces, which extend in parallel to the surface of the semiconductor substrate 10 including the bit line contacts CB, from the surface of the semiconductor 10 can be higher than the height of the surfaces of the gate electrodes, each having a stacked structure constructed by the floating gate electrode 40 and the control gate electrode 70 of memory cell transistors and select gate transistors, from the surface of the semiconductor substrate 10, where the surfaces of the gate electrodes extends in parallel to the surface of the semiconductor substrate 10.

According to the nonvolatile semiconductor memory and the fabrication method for the same of the sixth embodiment of the present invention, contact failures such as short-circuits between adjacent bit lines and contact failures such as electrical-openings of the bit line contacts CB to the element active regions in the three-transistor/cell flash memory, can be avoided so as to improve the production yield.

[Application]

Figure 23:
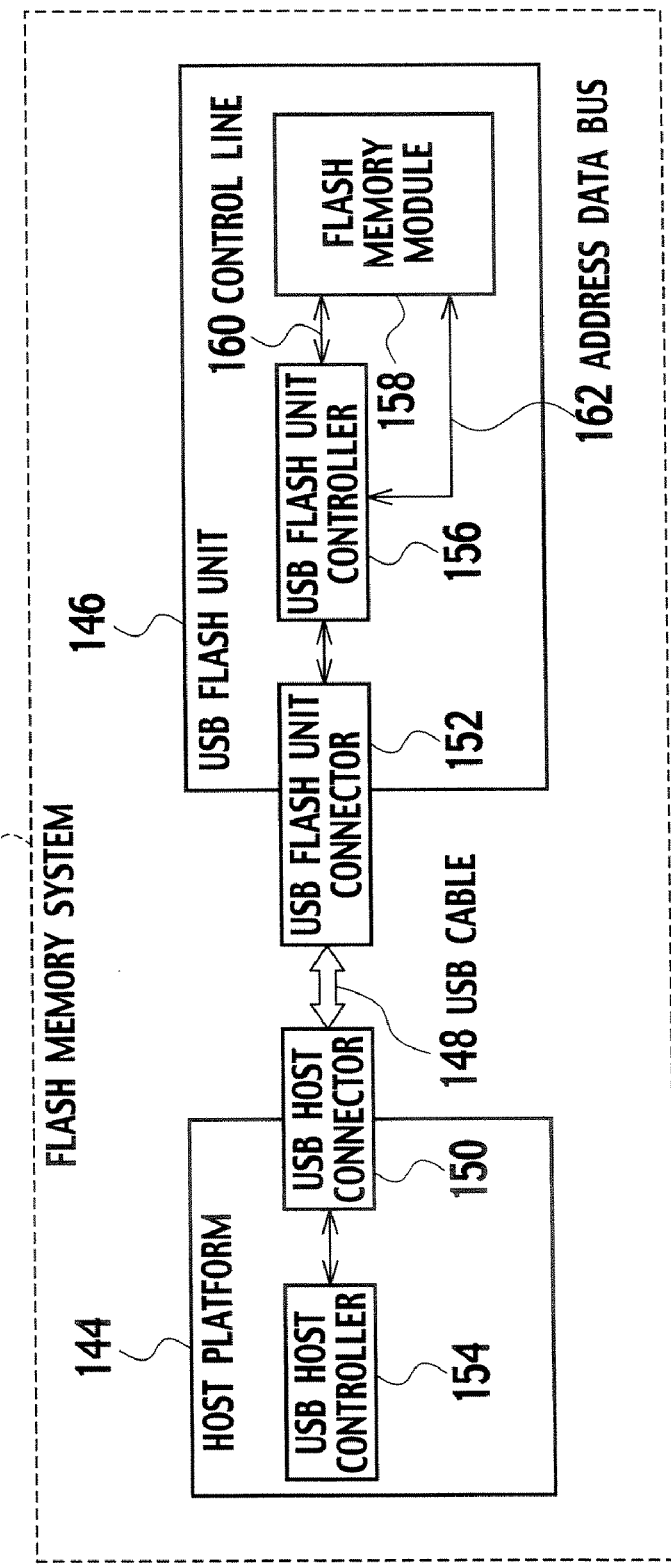
FIG. 23 is a schematic block diagram of main components of a flash memory device and system as an application of the nonvolatile memory according to the first through the sixth embodiment of the present invention.

FIG. 23 is a schematic block diagram of principle elements of a flash memory device and system. As shown in FIG. 23, a flash memory system 142 is configured with a host platform 144 and a universal serial bus (USB) flash unit 146.

The host platform 144 is connected to the USB flash unit 146 via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 includes a USB flash unit controller 156, which controls other elements in the USB flash unit 146 as well as controls the interface to the USB bus of the USB flash unit 146; the USB flash unit connector 152; and at least one flash memory module 158 configured with the nonvolatile semiconductor memory according to the first through the sixth embodiment of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer called an end point, which stores transfer data. The host platform 144 recognizes changes in the physical and electrical states such as removal/attachment of the USB flash unit 146 via another endpoint, and receives any existing to-be-received packets.

The host platform 144 requests services from the USB flash unit 146 by sending a request packet to the USB host controller 154. The USB host controller 154 transmits the packet to the USB cable 148. If the USB flash unit 146 is a unit including the end point that has received this request packet, this request will be accepted by the USB flash unit controller 156.

Next, the USB flash unit controller 156 performs various operations such as read-out, write-in or erasure of data from or to the flash memory module 158. In addition, it supports basic USB functions such as acquiring a USB address and the like. The USB flash unit controller 156 controls the flash memory module 158 via either a control line 160, which is used to control output of the flash memory module 158, or, for example, other various signals such as a chip enable signal CE, a read-out signal, or a write-in signal. Furthermore, the flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the results and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148 described above.

OTHER EMBODIMENTS

As described above, the present invention is described according to the first through the sixth embodiment; however, it should not be perceived that descriptions and drawings forming a part of this disclosure are not intended to limit the spirit and scope of the present invention. Various alternative embodiments, working examples, and operational techniques will become apparent from this disclosure for those skills in the art.

A stacked gate structure has been disclosed as the basic element structure of the memory cell transistor in the nonvolatile semiconductor memory according to the first through the sixth embodiment; however, it is not limited to this structure, and may naturally have a sidewall control gate structure, a MONOS structure, or the like. Furthermore, various variations and modifications are naturally possible in the fabrication process.

Moreover, the memory cell transistor of the nonvolatile semiconductor memory according to the first through the sixth embodiment is not limited to binary logic memory. For example, multi-valued logic memory, more specifically three or more valued memory is also applicable. For example, four-valued nonvolatile semiconductor memory can have a memory capacity twice that of the two-valued nonvolatile semiconductor memory. In addition, the present invention is applicable to m or more valued nonvolatile semiconductor memory (m>3).

As such, the present invention naturally includes various embodiments not described herein. Accordingly, the technical scope of the present invention is determined only by specified features of the invention according to the following claims that can be regarded appropriate from the above-mentioned descriptions.

While the present invention has been described according to the first through the sixth embodiment, these embodiments and drawings constituting a part of this disclosure do not limit the scope of the present invention. This disclosure shows those skilled in the present invention a variety of embodiments, alternative embodiments, and operational technologies.

Needless to say, the present invention includes a variety of embodiments or the like not disclosed herein. Therefore, the technical scope of the present invention should be defined by only inventive descriptions according to the claimed invention, which is appropriate according to the aforementioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation. Various modifications will become possible for those skilled in the art after receiving the teachings of the present disclosure without departing from the scope thereof.

What is claimed is:

1. A nonvolatile semiconductor memory, comprising:
a plurality of active regions extending along a column direction formed in a semiconductor substrate;
a plurality of word lines extending along a row direction;
a plurality of memory cell transistors, each of the memory cell transistors including a floating gate electrode provided on the semiconductor substrate via a tunneling insulating film, an inter-gate insulating film disposed on the floating gate electrode, and a control gate electrode disposed on the inter-gate insulating film, and the plurality of memory cell transistors are disposed on intersections of the plurality of word lines and the plurality of active regions;
a plurality of select gate lines extending along the row direction in parallel to the word lines;
a plurality of bit line contacts disposed on the active regions; and
a plurality of bit lines extending along the column direction and connected to the plurality of active regions via the bit line contacts;
wherein the bit line contacts include a first conductive layer having the same material as the floating gate electrode formed in contact with the semiconductor substrate and a second conductive layer having the same material as the control gate electrode disposed on the floating gate electrode,
a height of the upper surface of the first conductive layer from the surface of the active regions is substantially equal to a height of the upper surface of the floating gate electrodes from the surface of the active regions, and
a bottom surface of the first conductive layer is positioned lower than a bottom surface of the floating gate electrodes.

2. The nonvolatile semiconductor memory of claim 1, wherein a height of the upper surface of bit line contacts from the surface of the active regions is substantially equal to a height of the upper surface of the control gate electrodes.

3. The nonvolatile semiconductor memory of claim 1, wherein the bit line contacts are formed in a different fabrication processing from the control gate electrodes, and the height of the surface of bit line contacts from the surface of the active regions is higher than the height of the surface of the control gate electrodes.

4. The nonvolatile semiconductor memory of claim 1, wherein the planar pattern of the bit line contacts has a rectangular shape.

5. The nonvolatile semiconductor memory of claim 1, wherein the planar pattern of the bit line contacts has a wasp-waisted shape with the shortest measurement a along the row direction and the longest measurement b along the row direction, where $0<a<b$.

6. The nonvolatile semiconductor memory of claim 1, wherein the planar pattern of the bit line contacts has a wasp-waisted shape with the shortest measurement a along the row direction and the longest measurement b along the row direction, where $0=a<b$.

7. The nonvolatile semiconductor memory of claim 1, wherein the planar pattern of the bit line contacts has a wasp-waisted shape with the shortest measurement a along the row direction and the longest measurement b along the row direction, where $a<0<b$.

8. The nonvolatile semiconductor memory of claim 1, wherein the planar pattern of the bit line contacts has a pair of triangular shapes.

9. The nonvolatile semiconductor memory of claim 1, wherein wherein the planar pattern of the bit line contacts has a single triangular shape.

10. The nonvolatile semiconductor memory of claim 1, wherein the bit line contacts include an insulating film provided on a part of the first conductive layer, and the insulating film has the same material as the inter-gate insulating film.

* * * * *